United States Patent
Huang

(10) Patent No.: US 12,408,421 B2
(45) Date of Patent: Sep. 2, 2025

(54) SEMICONDUCTOR DEVICE WITH WORK FUNCTION LAYER

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 431 days.

(21) Appl. No.: 18/090,721

(22) Filed: Dec. 29, 2022

(65) Prior Publication Data

US 2024/0222370 A1    Jul. 4, 2024

(51) Int. Cl.
  *H10D 84/83*   (2025.01)
  *H10D 64/27*   (2025.01)
  *H10D 64/66*   (2025.01)
  *H10D 84/01*   (2025.01)
  *H10D 84/03*   (2025.01)

(52) U.S. Cl.
  CPC .......... *H10D 84/83* (2025.01); *H10D 64/513* (2025.01); *H10D 64/518* (2025.01); *H10D 64/667* (2025.01); *H10D 84/014* (2025.01); *H10D 84/0142* (2025.01); *H10D 84/038* (2025.01)

(58) Field of Classification Search
  CPC .... H10D 84/83; H10D 64/667; H10D 64/513; H10D 64/518; H10D 84/0142; H10D 84/038; H10D 84/014
  See application file for complete search history.

(56) References Cited

U.S. PATENT DOCUMENTS 9,589,960 B1 *  3/2017  Min ................. H10D 30/0221
9,793,267 B1 * 10/2017  Liu ..................... H01L 21/0332
(Continued)

FOREIGN PATENT DOCUMENTS

CN    104241367 A    12/2014
CN    114156270 A     3/2022
(Continued)

OTHER PUBLICATIONS

Office Action and Search Report dated on Mar. 7, 2024 related to German Application No. 102023119128.4.
(Continued)

*Primary Examiner* — Christine A Enad
(74) *Attorney, Agent, or Firm* — Xuan Zhang

(57) ABSTRACT

The present application discloses a semiconductor device. The semiconductor device includes a substrate; a peripheral gate structure including: a peripheral gate insulating layer inwardly positioned in the substrate and including a U-shaped cross-sectional profile, a peripheral work function layer positioned on the peripheral gate insulating layer and including a recess, a first peripheral interconnect layer positioned on the peripheral work function layer, a first peripheral liner layer positioned between the peripheral work function layer and the first peripheral interconnect layer, and a peripheral capping layer positioned on the first peripheral interconnect layer. The peripheral work function layer includes titanium, titanium nitride, silicon, silicon germanium, or a combination thereof. The first peripheral liner layer includes graphene. The first peripheral interconnect layer includes tungsten, tungsten nitride, or a combination thereof.

7 Claims, 16 Drawing Sheets

(56) References Cited

U.S. PATENT DOCUMENTS

| | | |
|---|---|---|
| 11,189,622 B1 | 11/2021 | Yang |
| 2014/0145332 A1* | 5/2014 | Ryan ................. H01L 21/76849 |
| | | 438/653 |
| 2014/0159145 A1 | 6/2014 | Park et al. |
| 2017/0125422 A1* | 5/2017 | Kang ................... H10D 64/667 |
| 2022/0051937 A1 | 2/2022 | Huang |
| 2022/0181457 A1* | 6/2022 | Yoon ...................... H10B 12/34 |

FOREIGN PATENT DOCUMENTS

| | | |
|---|---|---|
| DE | 102021113443 A1 | 3/2022 |
| TW | 202224188 A | 6/2022 |

OTHER PUBLICATIONS

Office Action and Search Report dated on Apr. 30, 2024 related to Taiwanese Application No. 112110239.

* cited by examiner

SEMICONDUCTOR DEVICE WITH WORK FUNCTION LAYER

TECHNICAL FIELD

The present disclosure relates to a semiconductor device and a method for fabricating the semiconductor device, and more particularly, to a semiconductor device with a work function layer and a method for fabricating the semiconductor device with the work function layer.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate; a peripheral gate structure including: a peripheral gate insulating layer inwardly positioned in the substrate and including a U-shaped cross-sectional profile, a peripheral work function layer positioned on the peripheral gate insulating layer and including a recess, a first peripheral interconnect layer positioned on the peripheral work function layer, a first peripheral liner layer positioned between the peripheral work function layer and the first peripheral interconnect layer, and a peripheral capping layer positioned on the first peripheral interconnect layer. The peripheral work function layer includes titanium, titanium nitride, silicon, silicon germanium, or a combination thereof. The first peripheral liner layer includes graphene. The first peripheral interconnect layer includes tungsten, tungsten nitride, or a combination thereof.

Another aspect of the present disclosure provides a semiconductor device including a substrate including an array area and a peripheral area; an array gate structure positioned in the array area of the substrate; and a peripheral gate structure including: a peripheral gate insulating layer inwardly positioned in the peripheral area of the substrate and including a U-shaped cross-sectional profile, a peripheral work function layer positioned on the peripheral gate insulating layer and including a recess, a first peripheral interconnect layer positioned on the peripheral work function layer, a first peripheral liner layer positioned between the peripheral work function layer and the first peripheral interconnect layer, and a peripheral capping layer positioned on the first peripheral interconnect layer. A width of the peripheral gate structure is greater than two times a width of the array gate structure. The peripheral work function layer includes titanium, titanium nitride, silicon, silicon germanium, or a combination thereof. The first peripheral liner layer includes graphene. The first peripheral interconnect layer includes tungsten, tungsten nitride, or a combination thereof.

Another aspect of the present disclosure provides a method for fabricating a semiconductor device including providing a substrate including an array area and a peripheral area; an array recess in the array area and forming a peripheral recess in the peripheral area; conformally forming an array gate insulating layer in the array recess and conformally forming a peripheral gate insulating layer in the peripheral recess; forming an array work function layer on the array gate insulating layer and forming a peripheral work function layer including a U-shaped cross-sectional profile on the peripheral gate insulating layer; conformally forming a layer of first liner material on the array work function layer and on the peripheral work function layer; forming a first array interconnector layer above the array work function layer and forming a first peripheral interconnect layer above the peripheral work function layer; performing a liner removal process to turn the layer of first liner material into a first array liner layer between the first array interconnector layer and the array work function layer and into a first peripheral liner layer between the first peripheral interconnect layer and the peripheral work function layer; and forming an array capping layer on the first array interconnector layer and forming a peripheral capping layer on the first peripheral interconnect layer. A width of the peripheral recess is greater than two times a width of the array recess.

Due to the design of the semiconductor device of the present disclosure, the peripheral work function layer, the first peripheral liner layer, and the first peripheral interconnect layer may make the peripheral gate structure have a low resistance. Therefore, the performance of the peripheral gate structure may be improved. As a result, the performance of the semiconductor device may also be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
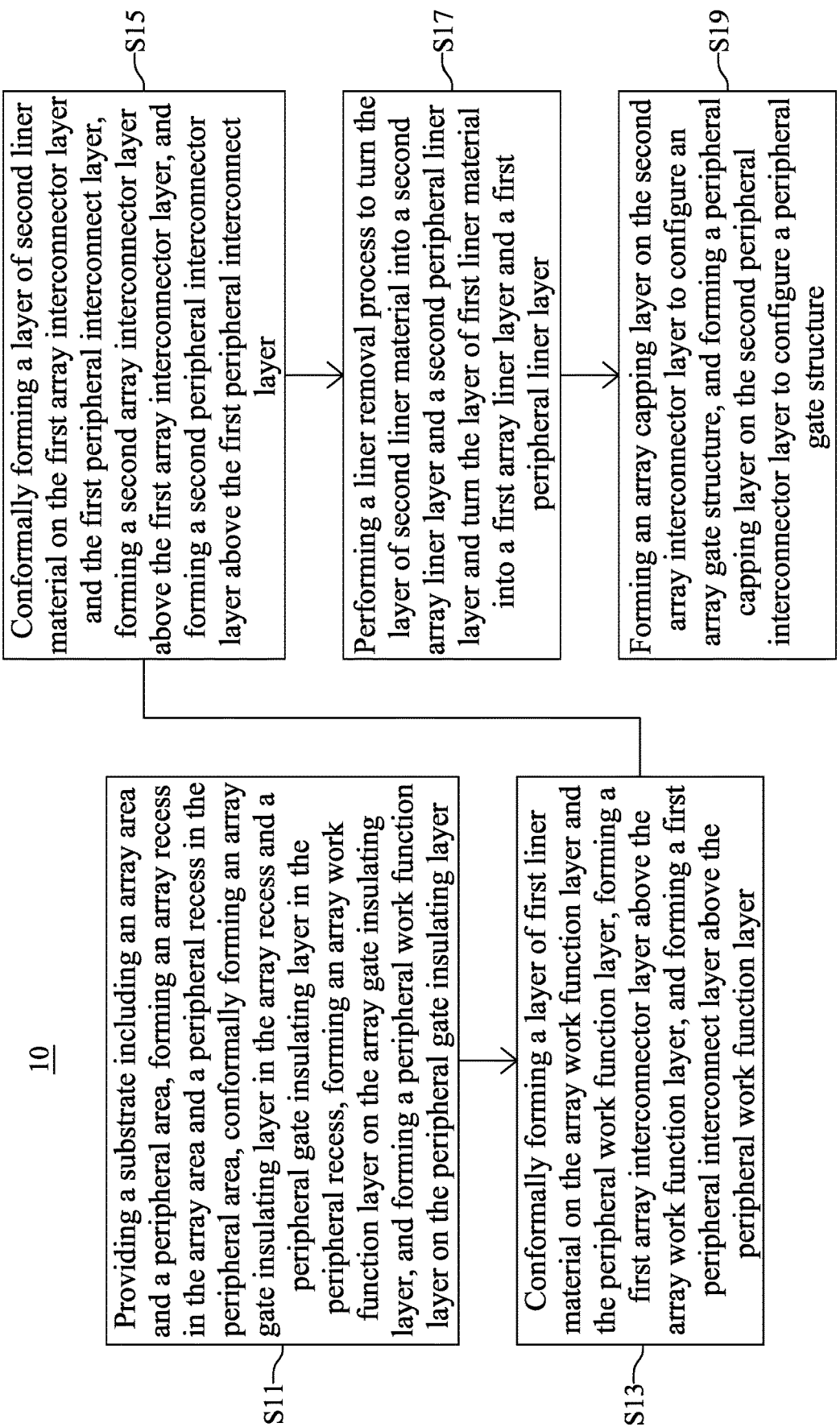
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that, in the description of the present disclosure, the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

It should be noted that, in the description of the present disclosure, the functions or steps noted herein may occur in an order different from the order noted in the figures. For example, two figures shown in succession may in fact be executed substantially concurrently or may sometimes be executed in a reversed order, depending upon the functionalities or steps involved.

FIG. 1 illustrates, in a flowchart diagram form, a method 10 for fabricating a semiconductor device 1 in accordance with one embodiment of the present disclosure. FIGS. 2 to 16 illustrate, in schematic cross-sectional view diagrams, a flow for fabricating the semiconductor device 1 in accordance with one embodiment of the present disclosure.

With reference to FIGS. 1 to 7, at step S11, a substrate 101 including an array area AA and a peripheral area PA may be provided, an array recess AR may be formed in the array area AA and a peripheral recess PR may be formed in the peripheral area PA, an array gate insulating layer 211 may be conformally formed in the array recess AR, a peripheral gate insulating layer 311 may be conformally formed in the peripheral recess PR, an array work function layer 213 on the array gate insulating layer 211, and a peripheral work function layer 313 on the peripheral gate insulating layer 311.

Figure 2:
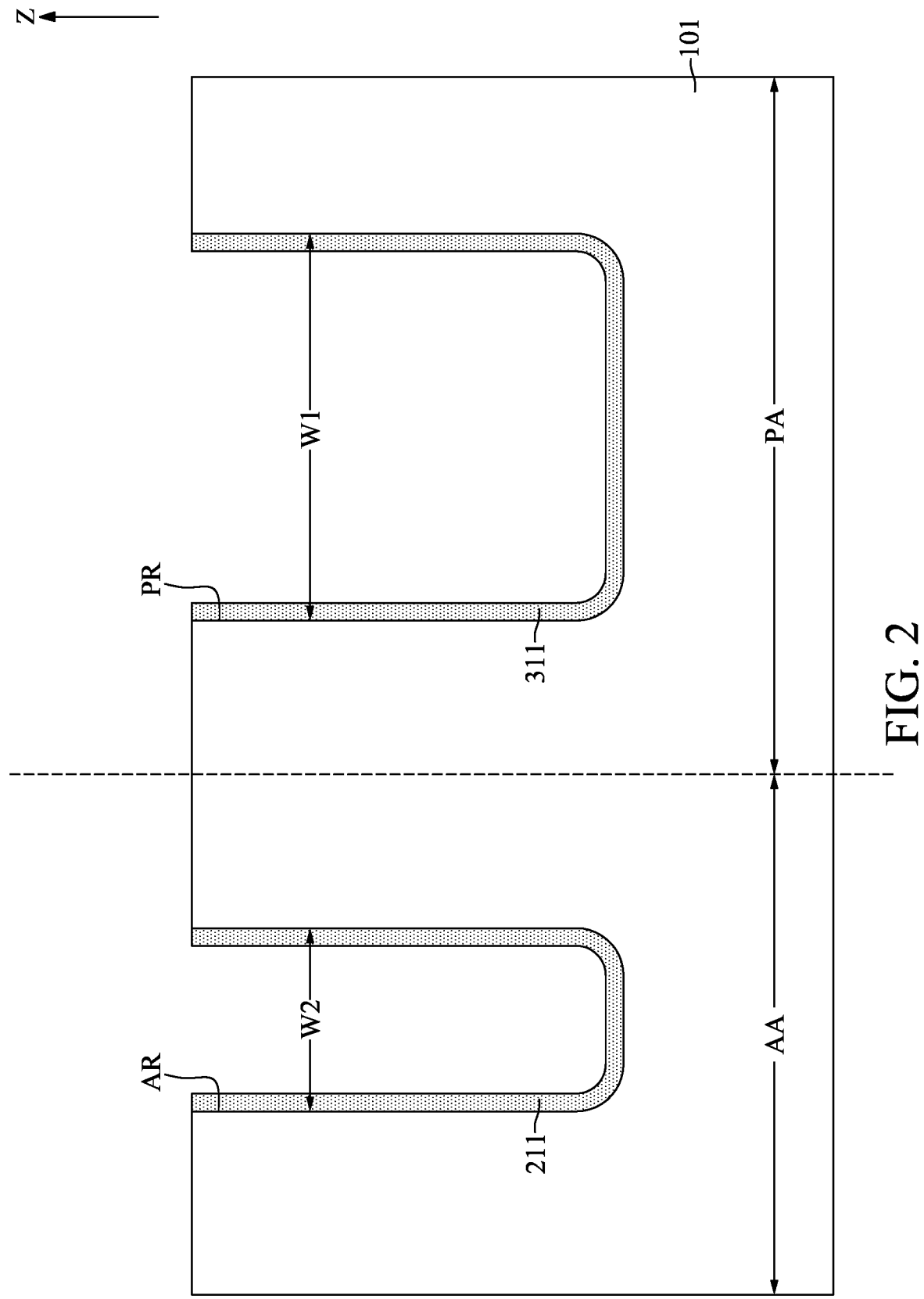
FIGS. 2 to 16 illustrate, in schematic cross-sectional view diagrams, a flow for fabricating the semiconductor device in accordance with one embodiment of the present disclosure.

With reference to FIG. 2, the substrate 101 may include the array area AA and the peripheral area PA. In some embodiments, the peripheral area PA may surround the array area AA. It should be noted that, in the description of the present disclosure, the array area AA may comprise a portion of the substrate 101 and spaces above and under the portion of the substrate 101. Describing an element as being disposed on the array area AA means that the element is disposed on a top surface of the portion of the substrate 101. Describing an element as being disposed in the array area AA means that the element is disposed in the portion of the substrate 101; however, a top surface of the element may be even with the top surface of the portion of the substrate 101. Describing an element as being disposed above the array area AA means that the element is disposed above the top surface of the portion of the substrate 101. Describing an element as being disposed under the array area AA means that the element is disposed under the bottom surface of the portion of the substrate 101; wherein the element contacts the bottom surface of the portion of the substrate 101 or is distant from the bottom surface of the portion of the substrate 101. Accordingly, the peripheral area PA may comprise another portion of the substrate 101 and spaces above and under the other portion of the substrate 101.

In the embodiment depicted, the array area AA may have an element density greater than that of the peripheral area PA. The element density may be a value defined by the elements (e.g., gate structures) disposed in the array area AA or the peripheral area PA divided by surface areas of the array area AA or peripheral area PA from a top-view perspective. From a cross-sectional perspective, a greater density may mean a smaller horizontal distance between adjacent elements.

In some embodiments, the substrate 101 may include a bulk semiconductor substrate that is composed of at least one semiconductor material. The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

In some embodiments, the substrate 101 may include a semiconductor-on-insulator structure which consists of, from bottom to top, a handle substrate, an insulator layer, and a topmost semiconductor material layer. The handle substrate and the topmost semiconductor material layer may be formed of the same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and about 200 nm. The insulator layer may eliminate leakage current between adjacent elements in the substrate 101 and reduce parasitic capacitance associated with source/drains.

It should be noted that, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

With reference to FIG. 2, the array recess AR may be formed in the array area AA of the substrate 101 and the peripheral recess PR may be formed in the peripheral area PA of the substrate 101. In some embodiments, the width W1 of the peripheral recess PR may be greater than at least two times the width W2 of the array recess AR. The array recess AR and the peripheral recess PR may be formed by a photolithography process and a following etch process.

With reference to FIG. 2, the array gate insulating layer 211 may be conformally formed in the array recess AR and the peripheral gate insulating layer 311 may be conformally formed in the peripheral recess PR. The array gate insulating layer 211 and the peripheral gate insulating layer 311 may respectively have a U-shaped cross-sectional profile. In other words, the array gate insulating layer 211 may be inwardly formed in the array area AA of the substrate 111 and the peripheral gate insulating layer 311 may be inwardly formed in the peripheral area PA of the substrate 111. In some embodiments, the array gate insulating layer 211 and the peripheral gate insulating layer 311 may have a thickness in a range of about 1 nm to about 7 nm, including about 1 nm, about 2 nm, about 3 nm, about 4 nm, about 5 nm, about 6 nm, or about 7 nm.

In some embodiments, the array gate insulating layer 211 and the peripheral gate insulating layer 311 may be formed by a thermal oxidation process. For example, the array gate insulating layer 211 and the peripheral gate insulating layer 311 may be formed by oxidizing the surface of the array recess AR and the peripheral recess PR. In some embodiments, the array gate insulating layer 211 and the peripheral gate insulating layer 311 may be formed by a deposition process such as a chemical vapor deposition or an atomic layer deposition. The array gate insulating layer 211 and the peripheral gate insulating layer 311 may include a high-k material, an oxide, a nitride, an oxynitride or combinations thereof. In some embodiments, after a liner polysilicon layer (not shown for clarity) is deposited, the gate insulating layer 211 and the peripheral gate insulating layer 311 may be formed by radical-oxidizing the liner polysilicon layer. In some embodiments, after a liner silicon nitride layer (not shown for clarity) is formed, the gate insulating layer 211 and the peripheral gate insulating layer 311 may be formed by radical-oxidizing the liner silicon nitride layer.

In some embodiments, the high-k material may include a hafnium-containing material. The hafnium-containing material may be, for example, hafnium oxide, hafnium silicon oxide, hafnium silicon oxynitride, or a combination thereof. In some embodiments, the high-k material may be, for example, lanthanum oxide, lanthanum aluminum oxide, zirconium oxide, zirconium silicon oxide, zirconium silicon oxynitride, aluminum oxide or a combination thereof.

It should be noted that the term "work function" refers to the bulk chemical potential of a material (e.g., metal) relative to the vacuum level.

Figure 3:
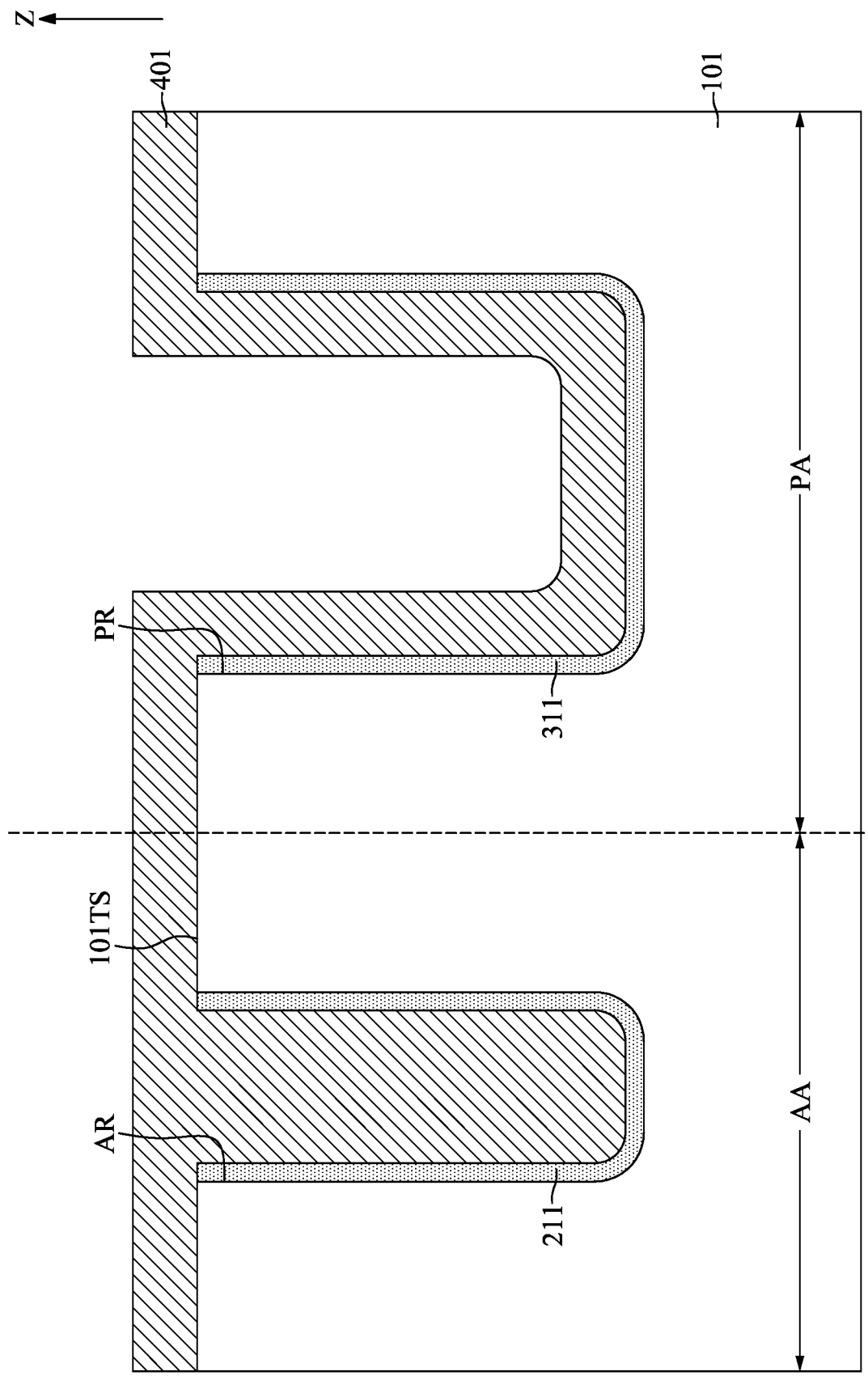

With reference to FIG. 3, a layer of first work function material 401 may be formed on the array gate insulating layer 211 and in the array recess AR, on the peripheral gate insulating layer 311 and in the peripheral recess PR, and on the top surface 101TS of the substrate 101. It should be noted that the layer of first work function material 401 may completely fill the array recess AR but partially fill the peripheral recess PR due to the different dimensions between the array recess AR and the peripheral recess PR. For example, the layer of first work function material 401 formed in the peripheral recess PR may include a U-shaped cross-sectional profile. In other words, the layer of first work function material 401 may be conformally formed on the peripheral gate insulating layer 311.

In some embodiments, the first work function material 401 may be, for example, titanium, titanium nitride, silicon, silicon germanium, or a combination thereof.

For example, in the present embodiment, the first work function material 401 is titanium nitride and may be formed by chemical vapor deposition. In some embodiments, the formation of the layer of first work function material 401 may include a source gas introducing step, a first purging step, a reactant flowing step, and a second purging step. The source gas introducing step, the first purging step, the reactant flowing step, and the second purging step may be referred to as one cycle. Multiple cycles may be performed to obtain the desired thickness of the layer of first work function material 401.

Detailedly, the intermediate semiconductor device illustrated in FIG. 2 may be loaded in a reaction chamber. In the source gas introducing step, source gases containing a precursor and a reactant may be introduced to the reaction chamber containing the intermediate semiconductor device.

The precursor and the reactant may diffuse across the boundary layer and reach the surface of the intermediate semiconductor device (i.e., the surfaces of the array gate insulating layer 211 and the peripheral gate insulating layer 311 and the top surface 101TS of the substrate 101). The precursor and the reactant may adsorb on and subsequently migrate on the surface aforementioned. The adsorbed precursor and the adsorbed reactant may react on the surface aforementioned and form solid byproducts. The solid byproducts may form nuclei on the surface aforementioned. The nuclei may grow into islands and the islands may merge into a continuous thin film on the surface aforementioned. In the first purging step, a purge gas such as argon may be injected into the reaction chamber to purge out the gaseous byproducts, unreacted precursor, and unreacted reactant.

In the reactant flowing step, the reactant may be solely introduced to the reaction chamber to turn the continuous thin film into the layer of first work function material 401. In the second purging step, a purge gas such as argon may be injected into the reaction chamber to purge out the gaseous byproducts and unreacted reactant.

In some embodiments, the formation of the layer of first work function material 401 using chemical vapor deposition may be performed with the assistance of plasma. The source of the plasma may be, for example, argon, hydrogen, or a combination thereof.

For example, the precursor may be titanium tetrachloride. The reactant may be ammonia. Titanium tetrachloride and ammonia may react on the surface and form a titanium nitride film including high chloride contamination due to incomplete reaction between titanium tetrachloride and ammonia. The ammonia in the reactant flowing step may reduce the chloride content of the titanium nitride film. After the ammonia treatment, the titanium nitride film may be referred to as the layer of first work function material 401.

Alternatively, in some other embodiments, the layer of first work function material 401 may be formed by atomic layer deposition such as photo-assisted atomic layer deposition or liquid injection atomic layer deposition. In some embodiments, the formation of the layer of first work function material 401 may include a first precursor introducing step, a first purging step, a second precursor introducing step, and a second purging step. The first precursor introducing step, the first purging step, the second precursor introducing step, and the second purging step may be referred to as one cycle. Multiple cycles may be performed to obtain the desired thickness of the layer of first work function material 401.

Detailedly, the intermediate semiconductor device illustrated in FIG. 2 may be loaded in the reaction chamber. In the first precursor introducing step, a first precursor may be introduced to the reaction chamber. The first precursor may diffuse across the boundary layer and reach the surface of the intermediate semiconductor device (i.e., the surfaces of the array gate insulating layer 211 and the peripheral gate insulating layer 311 and the top surface 101TS of the substrate 101). The first precursor may adsorb on the surface aforementioned to form a monolayer at a single atomic layer level. In the first purging step, a purge gas such as argon may be injected into the reaction chamber to purge out unreacted first precursor.

In the second precursor introducing step, a second precursor may be introduced to the reaction chamber. The second precursor may react with the monolayer and turn the monolayer into the layer of first work function material 401. In the second purging step, a purge gas such as argon may be injected into the reaction chamber to purge out unreacted second precursor and gaseous byproduct. Compared to the chemical vapor deposition, a particle generation caused by a gas phase reaction may be suppressed because the first precursor and the second are separately introduced.

For example, the first precursor may be titanium tetrachloride. The second precursor may be ammonia. Adsorbed titanium tetrachloride may form a titanium nitride monolayer. The ammonia in the second precursor introducing step may react with the titanium nitride monolayer and turn the titanium nitride monolayer into the layer of first work function material 401.

In some embodiments, the formation of the layer of first work function material 401 using atomic layer deposition may be performed with the assistance of plasma. The source of the plasma may be, for example, argon, hydrogen, oxygen, or a combination thereof. In some embodiments, the oxygen source may be, for example, water, oxygen gas, or ozone. In some embodiments, co-reactants may be introduced to the reaction chamber. The co-reactants may be selected from the group consisting of hydrogen, hydrogen plasma, oxygen, air, water, ammonia, hydrazines, alkylhydrazines, boranes, silanes, ozone and a combination thereof.

In some embodiments, the formation of the layer of first work function material 401 may be performed using the following process conditions. The substrate temperature may be between about 160° C. and about 300° C. The evaporator temperature may be about 175° C. The pressure of the reaction chamber may be about 5 mbar. The solvent for the first precursor and the second precursor may be toluene.

Figure 4:
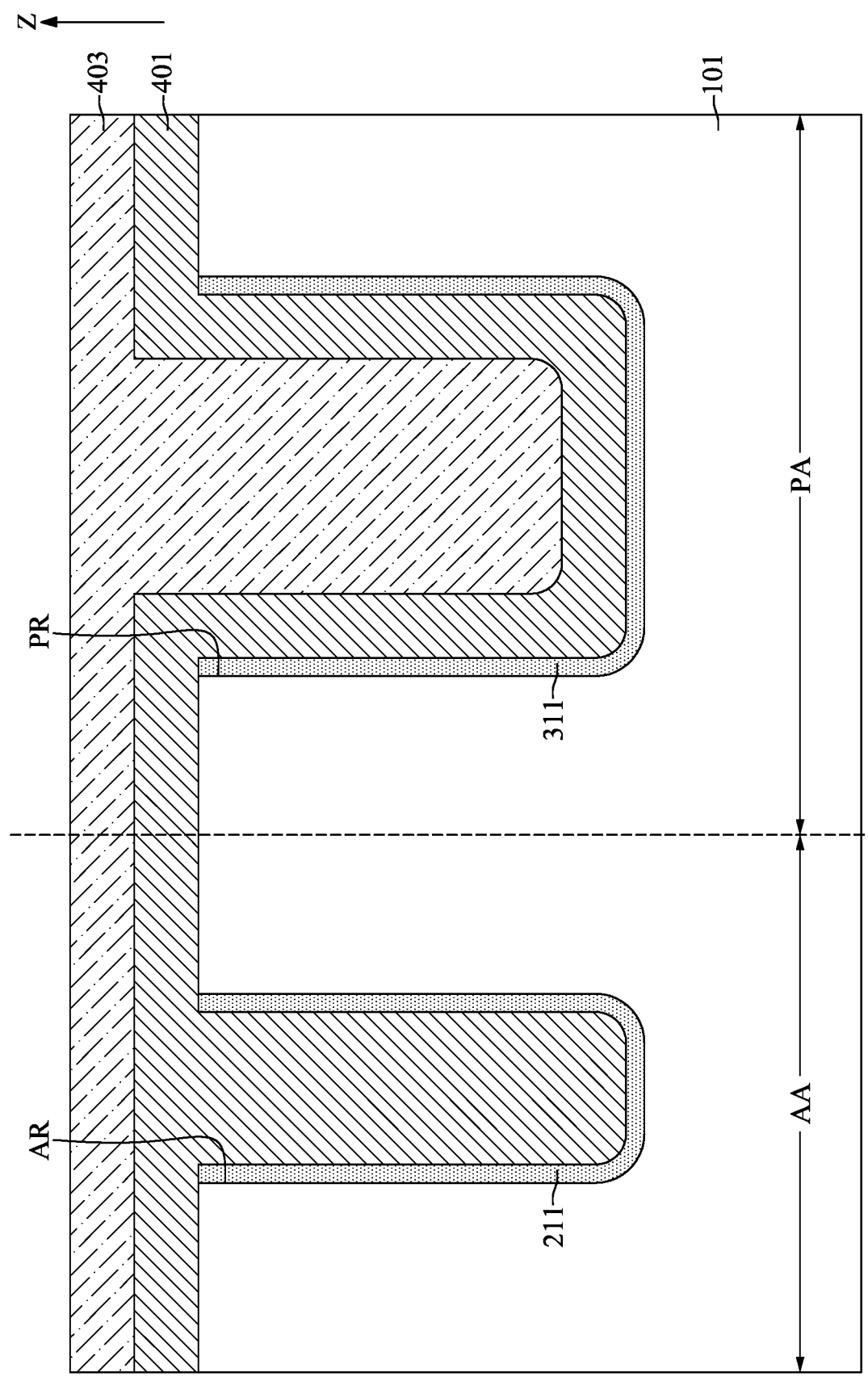

With reference to FIG. 4, a layer of first sacrificial material 403 may be formed on the layer of first work function material 401. The layer of first sacrificial material 403 may completely fill the peripheral recess PR. In some embodiments, the first sacrificial material 403 may be a material having etching selectivity to the first work function material 401. In some embodiments, the first sacrificial material 403 may be a photoresist.

Figure 5:
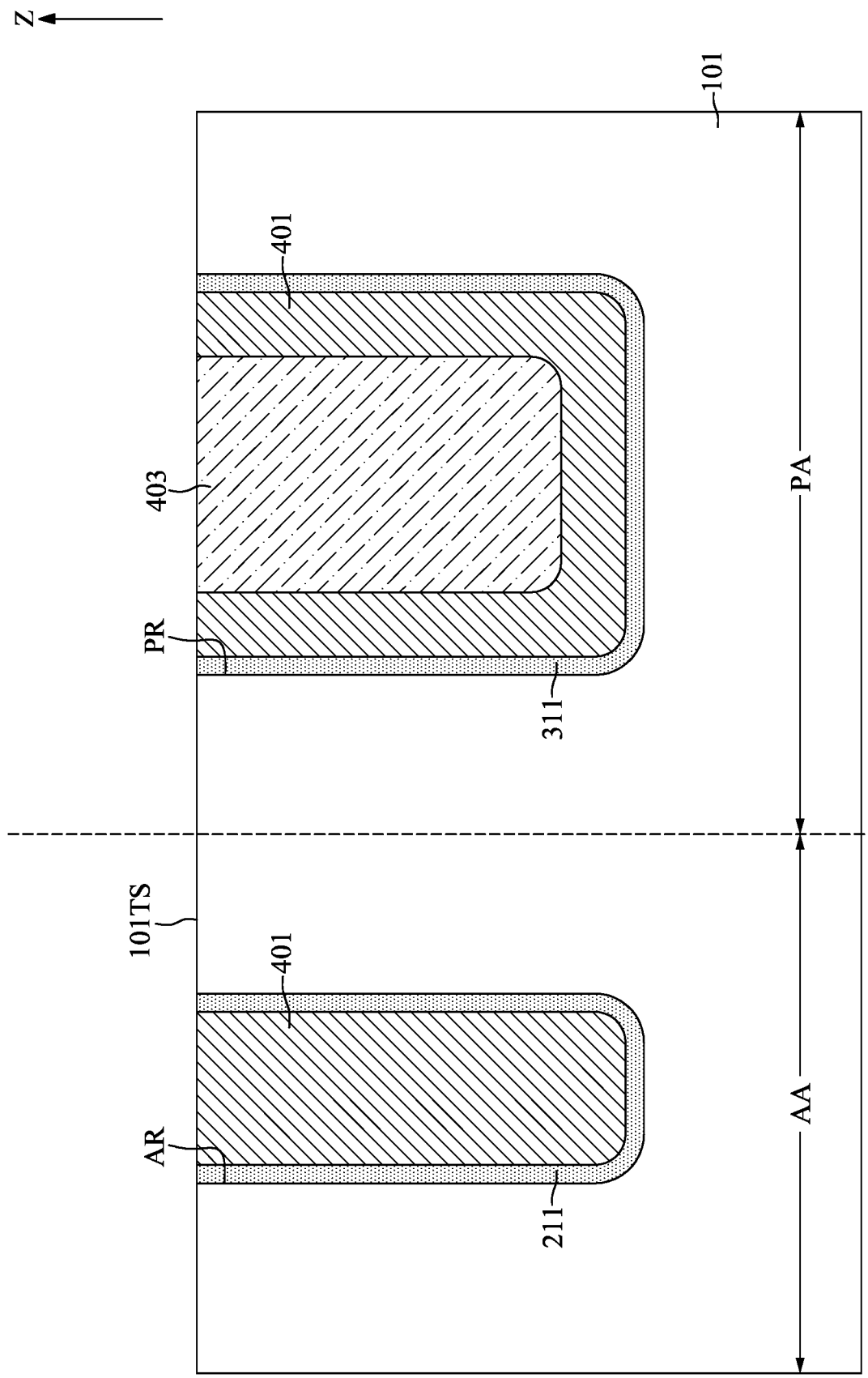

With reference to FIG. 5, a planarization process may be performed until the top surface 101TS of the substrate 101 is exposed to remove excess material and provide a substantially flat surface for subsequent processing steps. In the current stage, the array recess AR is completely filled by the first work function material 401 and the peripheral recess PR is filled by the first work function material 401 and the first sacrificial material 403.

Figure 6:
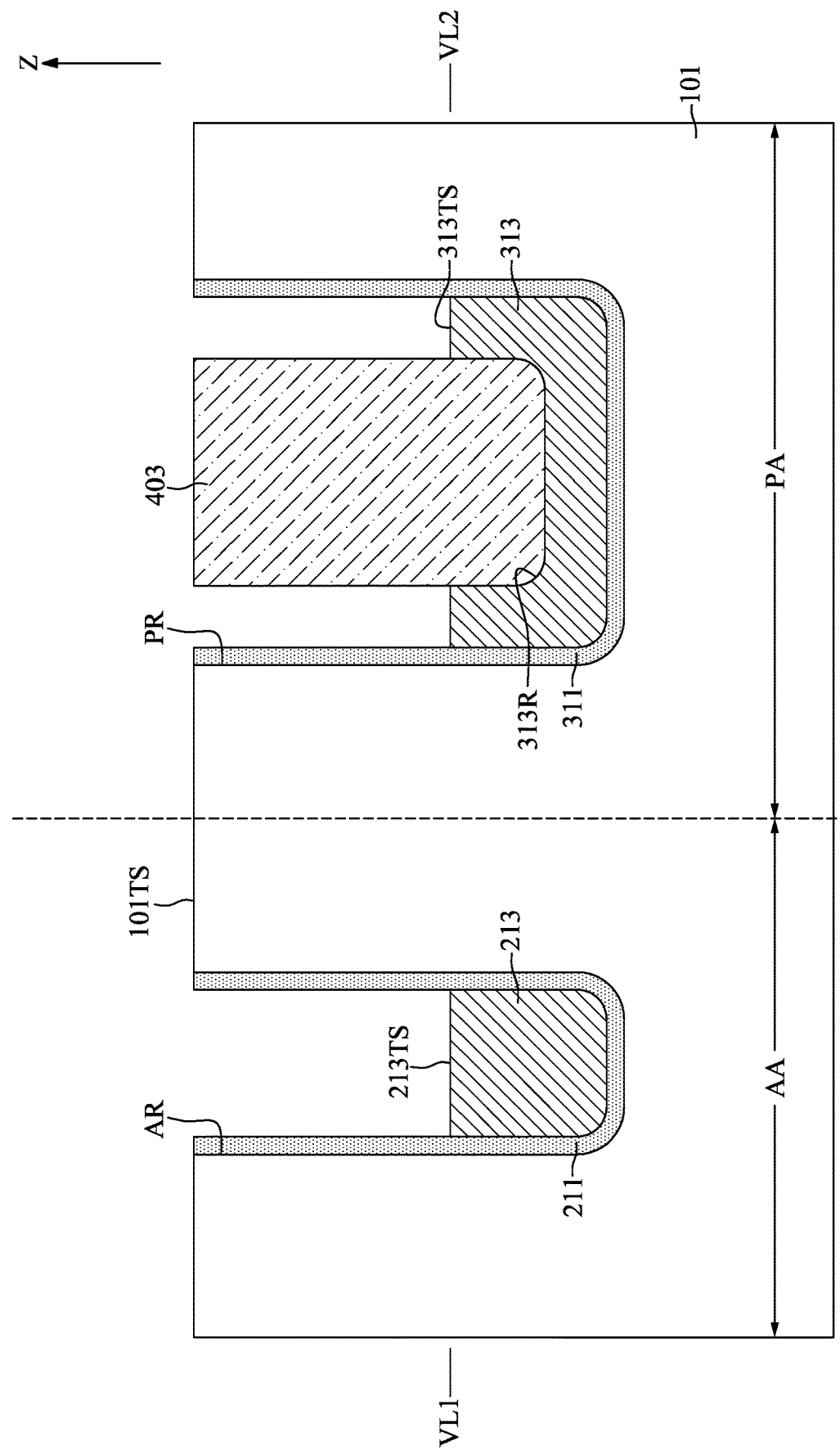

With reference to FIG. 6, a first etching back process may be performed to remove portions of the first sacrificial material 403. In some embodiments, the etch rate ratio of the first work function material 401 to the first sacrificial material 403 may be between about 100:1 and about 1.05:1, between about 15:1 and about 2:1, or between about 10:1 and about 2:1 during the first etching back process. In some embodiments, the etch rate ratio of the first work function material 401 to the array gate insulating layer 211 (or the peripheral gate insulating layer 311) may be between about 100:1 and about 1.05:1, between about 15:1 and about 2:1, or between about 10:1 and about 2:1 during the first etching back process. In some embodiments, the etch rate ratio of the first work function material 401 to the substrate 101 may be between about 100:1 and about 1.05:1, between about 15:1 and about 2:1, or between about 10:1 and about 2:1 during the first etching back process.

After the first etching back process, the remaining first work function material 401 in the array recess AR may be referred to as the array work function layer 213. The remaining first work function material 401 in the peripheral recess PR may be referred to as the peripheral work function layer 313. In some embodiments, the top surface 211TS of the array gate insulating layer 211 and the top surface 311TS of the peripheral gate insulating layer 311 may be substantially coplanar. In some embodiments, the top surface 211TS of the array gate insulating layer 211 may be at the vertical level VL1 different from the vertical level VL2 of the top surface 311TS of the peripheral gate insulating layer 311. The peripheral work function layer 313 may have a U-shaped cross-sectional profile and may include a recess 313R.

Figure 7:
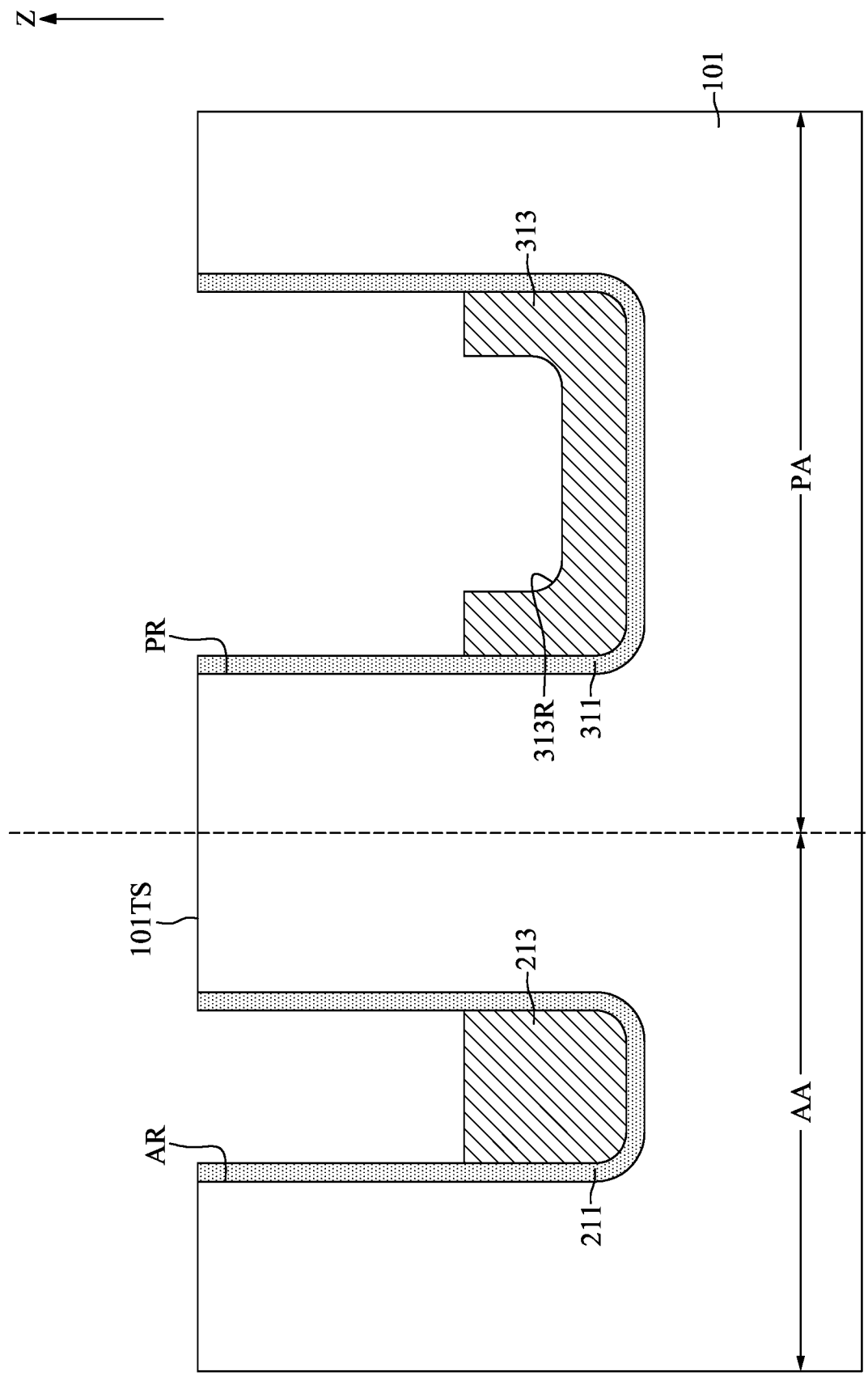

With reference to FIG. 7, a removal process may be performed to completely remove the first sacrificial material 403. In some embodiments, the removal process may be an ashing process when the first sacrificial material 403 is the photoresist. In some embodiments, the removal process may be an etching process such as a wet etching process. In some embodiments, the removal rate ratio of the first sacrificial material 403 to the array gate insulating layer 211 (or the peripheral gate insulating layer 311) may be between about 100:1 and about 1.05:1, between about 15:1 and about 2:1, or between about 10:1 and about 2:1 during the removal process. In some embodiments, the removal rate ratio of the first sacrificial material 403 to the array work function layer 213 (or the peripheral work function layer 313) may be between about 100:1 and about 1.05:1, between about 15:1 and about 2:1, or between about 10:1 and about 2:1 during the removal process. In some embodiments, the removal rate ratio of the first sacrificial material 403 to the substrate 101 may be between about 100:1 and about 1.05:1, between about 15:1 and about 2:1, or between about 10:1 and about 2:1 during the removal process.

With reference to FIG. 1 and FIGS. 8 to 10, at step S13, a layer of first liner material 405 may be conformally formed on the array work function layer 213 and the peripheral work function layer 313, a first array interconnector layer 217 may be formed above the array work function layer 213, and a first peripheral interconnect layer 317 may be formed above the peripheral work function layer 313.

Figure 8:
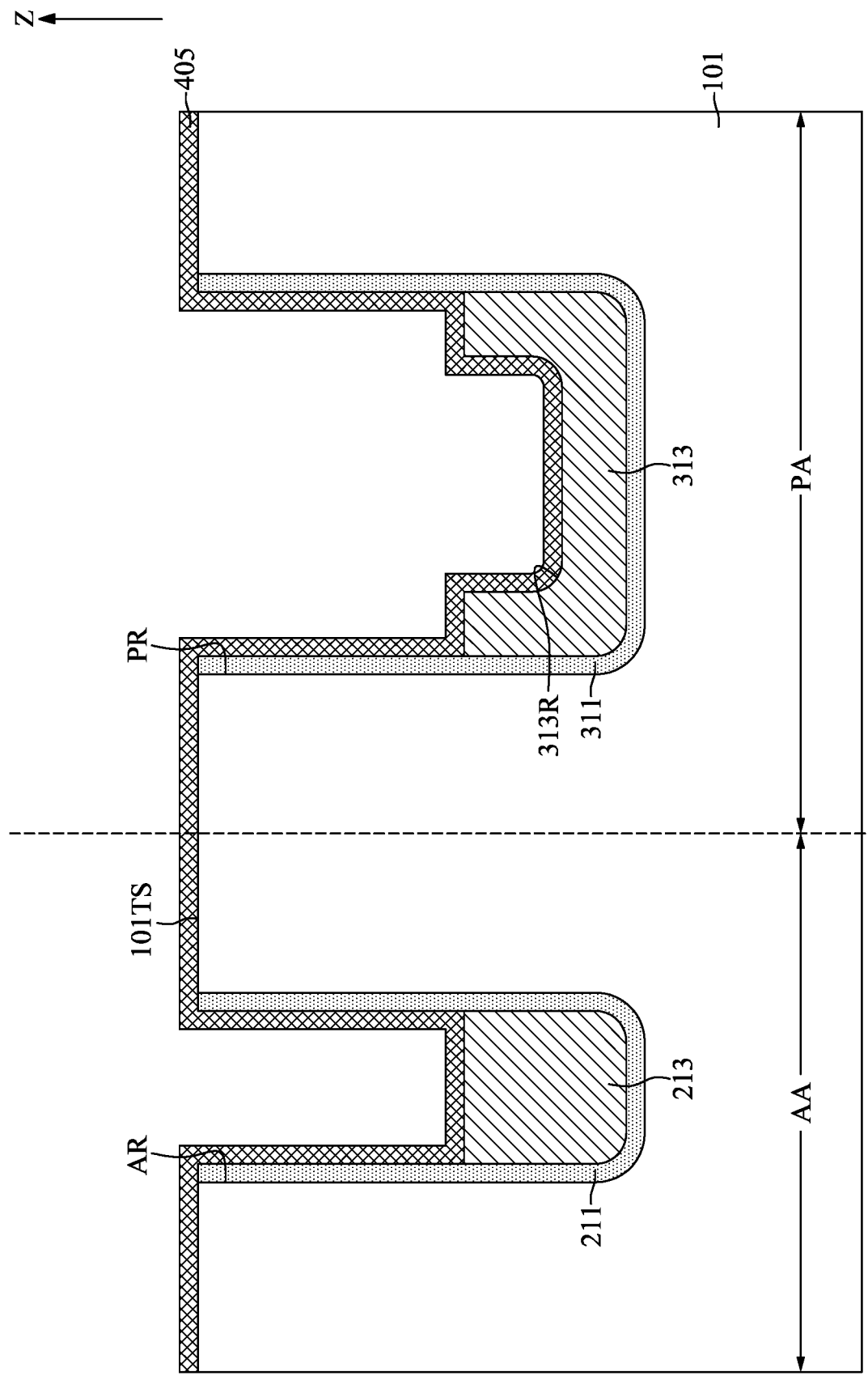

With reference to FIG. 8, the layer of first liner material 405 may be conformally formed on the array work function layer 213 and in the array recess AR, on the peripheral work function layer 313 and in the peripheral recess PR, and on the top surface 101TS of the substrate 101. In some embodiments, the first liner material 405 may be a material having etching selectivity to the array gate insulating layer 211 or the peripheral gate insulating layer 311. In some embodiments, the first liner material 405 may be a material having etching selectivity to the array gate insulating layer 211 or the peripheral gate insulating layer 311. In some embodiments, the first liner material 405 may be a material having etching selectivity to the substrate 101. In some embodiments, the first liner material 405 may be, for example, a material including $sp^2$ hybridized carbon atoms. In some embodiments, the first liner material 405 may be, for example, a material including carbons having hexagonal crystal structures. In some embodiments, the first liner material 405 may be, for example, graphene, graphite, or the like.

In some embodiments, the layer of first liner material 405 may be formed on a catalyst substrate and then transferred onto the intermediate semiconductor device illustrated in FIG. 7. The catalyst substrate may include nickel, copper, cobalt, platinum, silver, ruthenium, iridium, palladium, alloy of iron and nickel, alloy of copper and nickel, alloy of nickel and molybdenum, alloy of gold and nickel, and alloy of cobalt and copper.

In some embodiments, the layer of first liner material 405 may be formed with the assistance of catalysts. The catalysts may be single crystalline metal or polycrystalline metal, binary alloy, or liquid metal. The single crystalline metal or polycrystalline metal may be, for example, nickel, copper, cobalt, platinum, silver, ruthenium, iridium, or palladium. The binary alloy may be, for example, alloy of iron and nickel, alloy of copper and nickel, alloy of nickel and molybdenum, alloy of gold and nickel, and alloy of cobalt and copper. The liquid metal may be, for example, liquid gallium, liquid indium, or liquid copper.

In some embodiments, a catalytic conductive layer (not shown for clarity) may be conformally formed on the array work function layer 213 and in the array recess AR, on the peripheral work function layer 313 and in the peripheral recess PR, and on the top surface 101TS of the substrate 101. The layer of first liner material 405 may be formed on the catalytic conductive layer. The catalytic conductive layer may include nickel, copper, cobalt, platinum, silver, ruthenium, iridium, palladium, alloy of iron and nickel, alloy of copper and nickel, alloy of nickel and molybdenum, alloy of gold and nickel, and alloy of cobalt and copper.

Figure 9:
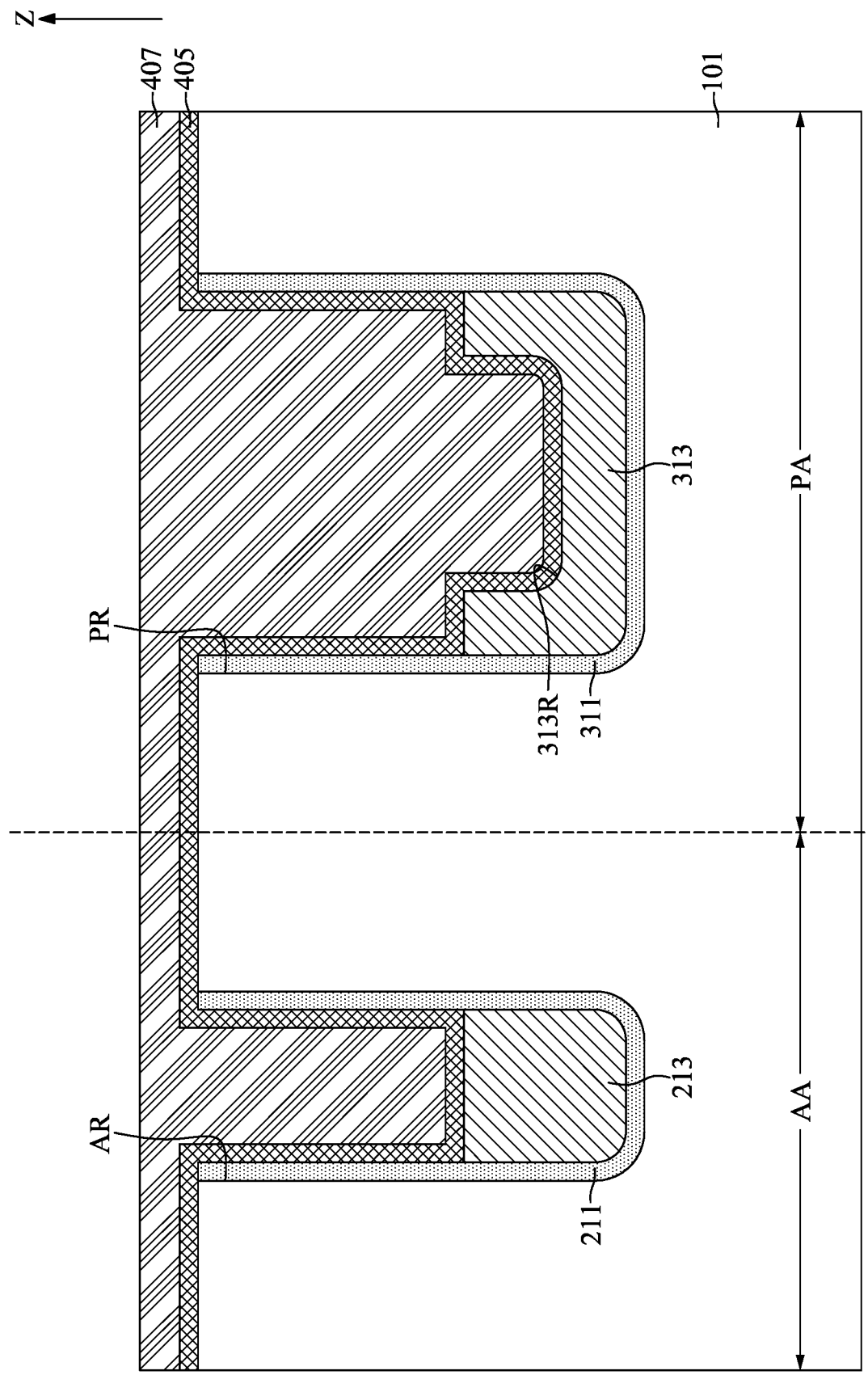

With reference to FIG. 9, a layer of first interconnector material 407 may be formed on the layer of first liner material 405 and completely fill the array recess AR and the peripheral recess PR. In some embodiments, the first interconnector material 407 may be, for example, tungsten, tungsten, or a combination thereof. In some embodiments, the layer of first interconnector material 407 may be formed by, for example, a pulse nucleation method, chemical vapor deposition, physical vapor deposition, or other applicable deposition processes. In some embodiments, a planarization process, such as chemical mechanical polishing, may be performed to remove excess material and provide a substantially flat surface for subsequent processing steps.

Figure 10:
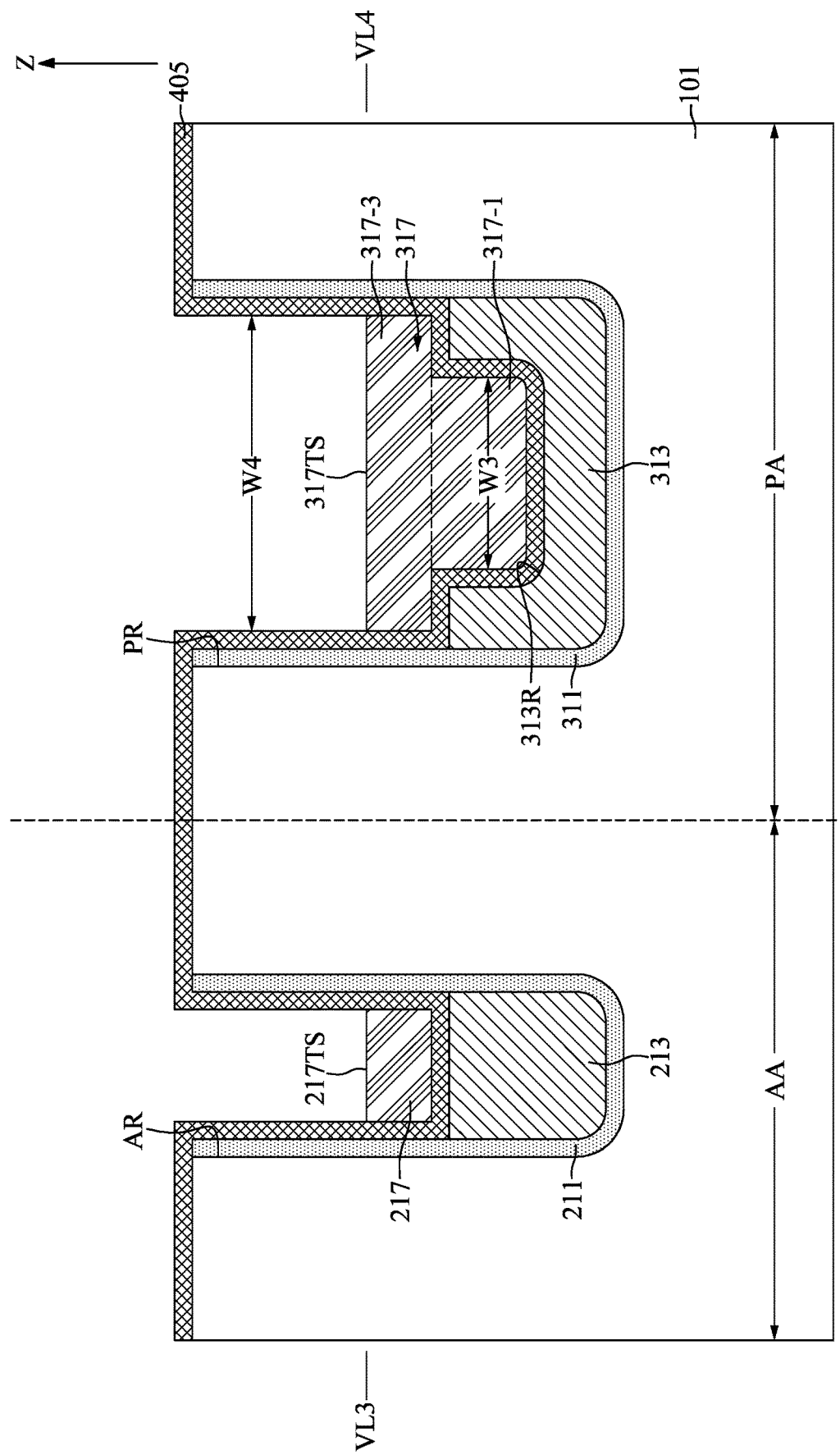

With reference to FIG. 10, a second etching back process may be performed to remove portions of the first interconnector material 407. In some embodiments, the etch rate ratio of the first interconnector material 407 to the first liner material 405 may be between about 100:1 and about 1.05:1, between about 15:1 and about 2:1, or between about 10:1 and about 2:1 during the second etching back process. After the second etching back process, the remaining first interconnector material 407 in the array recess AR may be referred to as the first array interconnector layer 217. The remaining first interconnector material 407 in the peripheral recess PR may be referred to as the first peripheral interconnect layer 317. In some embodiments, the top surface 217TS of the first array interconnector layer 217 and the top surface 317TS of the first peripheral interconnect layer 317 may be substantially coplanar. In some embodiments, the top surface 217TS of the first array interconnector layer 217 may be at the vertical level VL3 different from the vertical level VL4 of the top surface 317TS of the first peripheral interconnect layer 317.

With reference to FIG. 10, in some embodiments, the first peripheral interconnect layer 317 may include a bottom portion 317-1 and a top portion 317-3. The bottom portion 317-1 may be formed on the layer of first liner material 405 and in the recess 313R of the peripheral gate insulating layer 311. The top portion 317-3 may be formed on the bottom portion 317-1. The width W3 of the bottom portion 317-1 may be less than the width W4 of the top portion 317-3.

With reference to FIG. 1 and FIGS. 11 to 13, at step S15, a layer of second liner material 409 may be conformally formed on the first array interconnector layer 217 and the first peripheral interconnect layer 317, a second array interconnector layer 221 may be formed above the first array interconnector layer 217, and a second peripheral interconnector layer 321 may be formed above the first peripheral interconnect layer 317.

Figure 11:
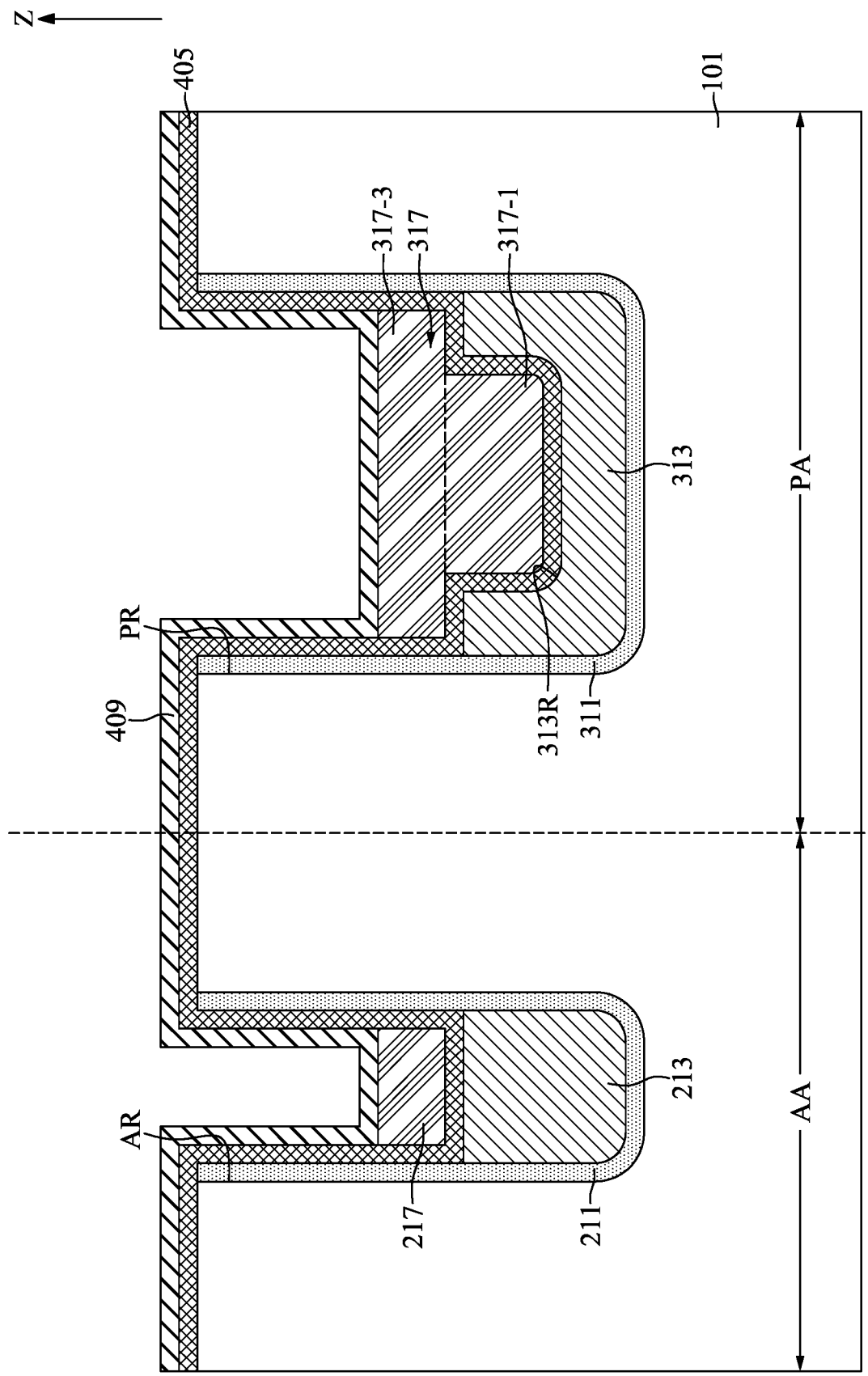

With reference to FIG. 11, the layer of second liner material 409 may be conformally formed on the first array interconnector layer 217 and in the array recess AR, on the first peripheral interconnect layer 317 and in the peripheral recess PR, and on the layer of first liner material 405.

In some embodiments, the second liner material 409 may be a material having etching selectivity to the array gate insulating layer 211 or the peripheral gate insulating layer 311. In some embodiments, the second liner material 409 may be the same material as the first liner material 405. That is, in some embodiments, the second liner material 409 may be a material having etching selectivity to the array gate insulating layer 211 or the peripheral gate insulating layer 311. In some embodiments, the second liner material 409 may be a material having etching selectivity to the substrate 101. In some embodiments, the second liner material 409 may be, for example, a material including $sp^2$ hybridized carbon atoms. In some embodiments, the second liner material 409 may be, for example, a material including carbons having hexagonal crystal structures. In some embodiments, the second liner material 409 may be, for example, graphene, graphite, or the like.

In some embodiments, the layer of second liner material 409 may be formed on a catalyst substrate and then transferred onto the intermediate semiconductor device illustrated in FIG. 10. The catalyst substrate may include nickel, copper, cobalt, platinum, silver, ruthenium, iridium, palladium, alloy of iron and nickel, alloy of copper and nickel, alloy of nickel and molybdenum, alloy of gold and nickel, and alloy of cobalt and copper.

In some embodiments, the layer of second liner material 409 may be formed with the assistance of catalysts. The catalysts may be single crystalline metal or polycrystalline metal, binary alloy, or liquid metal. The single crystalline metal or polycrystalline metal may be, for example, nickel, copper, cobalt, platinum, silver, ruthenium, iridium, or palladium. The binary alloy may be, for example, alloy of iron and nickel, alloy of copper and nickel, alloy of nickel and molybdenum, alloy of gold and nickel, and alloy of cobalt and copper. The liquid metal may be, for example, liquid gallium, liquid indium, or liquid copper.

In some embodiments, a catalytic conductive layer (not shown for clarity) may be conformally formed on the first array interconnector layer 217 and in the array recess AR, on the first peripheral interconnect layer 317 and in the peripheral recess PR, and on the layer of first liner material 405. The layer of second liner material 409 may be formed on the catalytic conductive layer. The catalytic conductive layer may include nickel, copper, cobalt, platinum, silver, ruthenium, iridium, palladium, alloy of iron and nickel, alloy of copper and nickel, alloy of nickel and molybdenum, alloy of gold and nickel, and alloy of cobalt and copper.

Figure 12:
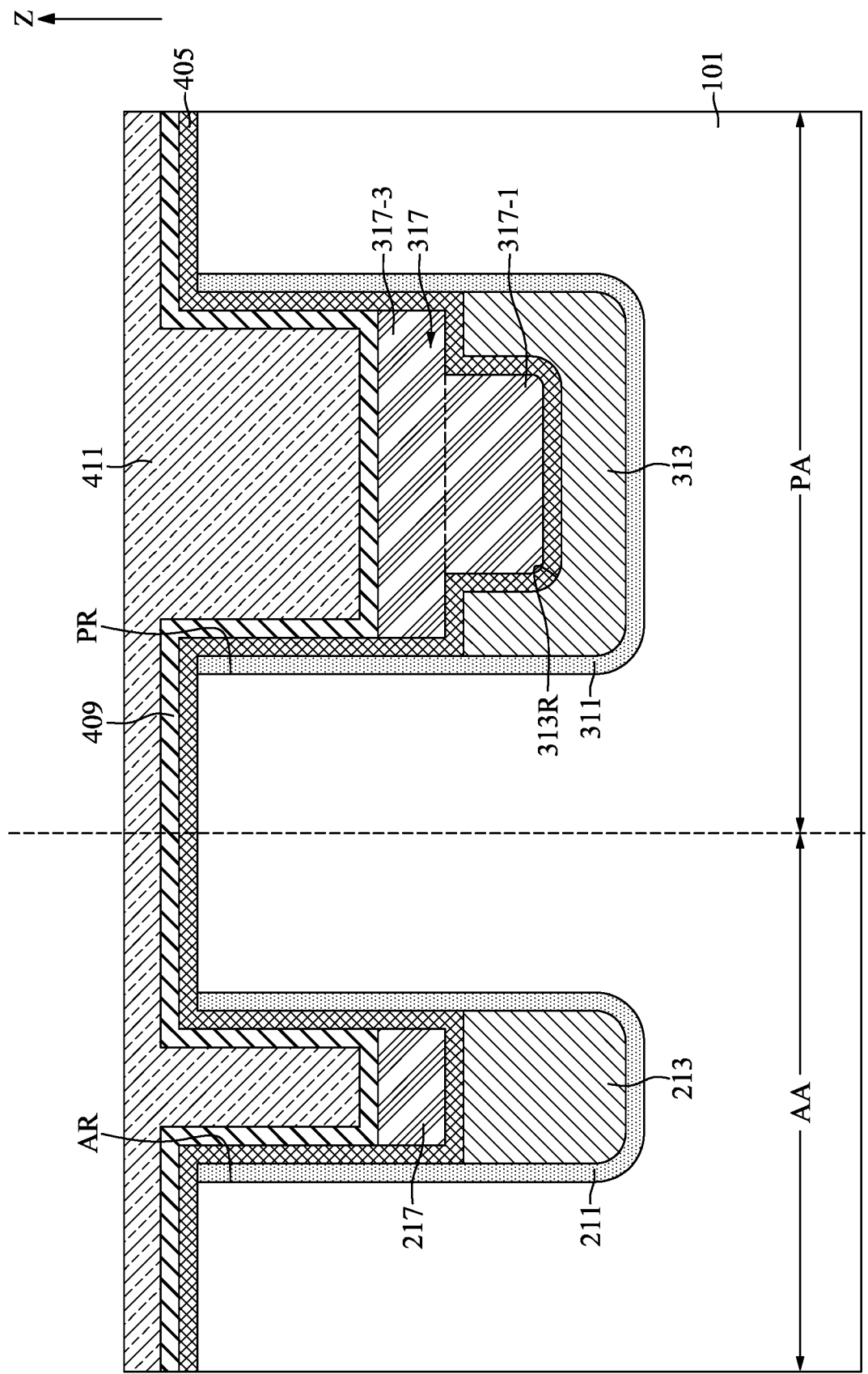

With reference to FIG. 12, a layer of second interconnector material 411 may be formed on the layer of second liner material 409 and to completely fill the array recess AR and the peripheral recess PR. A planarization process, such as chemical mechanical polishing, may be performed to remove excess material and provide a substantially flat surface for subsequent processing steps. In some embodiments, the second interconnector material 411 may be, for example, molybdenum or other applicable conductive materials.

In some embodiments, the second interconnector material 411 may be formed by a chemical vapor deposition process. For example, the intermediate semiconductor device illustrated in FIG. 11 may be exposed to a molybdenum precursor and a reactant. In some embodiments, the reactant may flow continuously and the molybdenum precursor flow to the chamber may be turned on and off.

In some embodiments, the molybdenum precursor may include a molybdenum halide. In some embodiments, the molybdenum halide may include molybdenum fluoride, molybdenum chloride, or combinations thereof. In some embodiments, the molybdenum precursor may be flowed over the intermediate semiconductor device illustrated in FIG. 11 using a carrier gas. In some embodiments, the carrier gas may be flowed through an ampoule including the molybdenum precursor. In some embodiments, the carrier gas may be an inert gas. In some embodiments, the inert gas may include one or more of $N_2$, Ar, and He.

In some embodiments, the flow rate of the molybdenum precursor may be in a range of from 100 slm to 1000 slm, from 100 slm to 700 slm, from 100 slm to 400 slm, from 400 slm to 1000 slm, from 400 slm to 700 slm or from 700 slm to 1000 slm. In some embodiments, the duration of the molybdenum precursor may be in a range of from 0.3 seconds to 5 seconds, from 0.3 seconds to 3 seconds, from 0.3 seconds to 1 seconds, from 1 seconds to 5 seconds, from 1 seconds to 3 seconds or from 3 seconds to 5 seconds.

In some embodiments, the intermediate semiconductor device illustrated in FIG. 11 may be exposed to a continuous flow or a plurality of pulses of the molybdenum precursor. In some embodiments, the plurality of pulses of the molybdenum precursor may have a wait time in a range of from 0.3 seconds to 30 seconds, from 0.3 seconds to 10 seconds, from 0.3 seconds to 5 seconds, from 0.3 seconds to 1 seconds, from 0.5 seconds to 5 seconds, from 1 seconds to 30 seconds, from 1 seconds to 10 seconds, from 1 seconds to 5 seconds, from 5 seconds to 30 seconds, from 5 seconds to 10 seconds or from 10 seconds to 30 seconds.

In some embodiments, each of the plurality of pulses of the molybdenum precursor may be applied for a time duration in a range of from 0.3 seconds to 5 seconds, from 0.3 seconds to 3 seconds, from 0.3 seconds to 1 seconds, from 1 seconds to 5 seconds, from 1 seconds to 3 seconds or from 3 seconds to 5 seconds. In some embodiments, at least one of the plurality of pulses of the molybdenum precursor may be applied for a time duration in a range of from 0.3 seconds to 5 seconds, from 0.3 seconds to 3 seconds, from 0.3 seconds to 1 seconds, from 1 seconds to 5 seconds, from 1 seconds to 3 seconds or from 3 seconds to 5 seconds.

In some embodiments, the reactant may include an oxidizing agent, a reducing agent, or a combination thereof. In some embodiments, the reactant may include hydrogen, ammonia, silane, polysilane, or a combination thereof. In some embodiments, silane may be selected from one or more of disilane, trisilane, tetrasilane, higher order silanes, and substituted silane. In some embodiments, the first reactant may be flowed over the intermediate semiconductor device illustrated in FIG. 11 using a carrier gas. In some embodiments, the carrier gas may be an inert gas. In some embodiments, the inert gas may include one or more of $N_2$, Ar, and He.

In some embodiments, the flow rate of the reactant may be in a range of from 0.5 slm to 15 slm, from 0.5 slm to 10 slm, from 0.5 slm to 5 slm, from 5 slm to 15 slm, from 5 slm to 10 slm or from 10 slm to 15 slm. In some embodiments, the duration of the reactant may be in a range of from 0.5 seconds to 10 seconds, from 0.5 seconds to 5 seconds, from 0.5 seconds to 1 seconds, from 1 seconds to 10 seconds, from 1 seconds to 5 seconds or from 5 seconds to 10 seconds.

In some embodiments, the intermediate semiconductor device illustrated in FIG. 11 may be exposed to a continuous flow or a plurality of pulses of the reactant. In some embodiments, the plurality of pulses of the reactant may have a wait time in a range of from 0.3 seconds to 30 seconds, from 0.3 seconds to 10 seconds, from 0.3 seconds to 5 seconds, from 0.3 seconds to 1 seconds, from 0.5 seconds to 5 seconds, from 1 seconds to 30 seconds, from 1 seconds to 10 seconds, from 1 seconds to 5 seconds, from 5 seconds to 30 seconds, from 5 seconds to 10 seconds or from 10 seconds to 30 seconds.

In some embodiments, each of the plurality of pulses of the first reactant may be applied for a time duration in a range of from 0.5 seconds to 10 seconds, from 0.5 seconds to 5 seconds, from 0.5 seconds to 1 seconds, from 1 seconds to 10 seconds, from 1 seconds to 5 seconds or from 5 seconds to 10 seconds. In some embodiments, at least one of the plurality of pulses of the first reactant may be applied for a time duration in a range of from 0.5 seconds to 10 seconds, from 0.5 seconds to 5 seconds, from 0.5 seconds to 1 seconds, from 1 seconds to 10 seconds, from 1 seconds to 5 seconds or from 5 seconds to 10 seconds.

In some embodiments, the layer of second interconnector material 411 may be formed at a pressure in a range of from 2 Torr to 60 Torr, from 2 Torr to 40 Torr, from 2 Torr to 20 Torr, from 20 Torr to 60 Torr, from 20 Torr to 40 Torr or from 40 Torr to 60 Torr. In some embodiments, the layer of second interconnector material 411 may be formed at a temperature in a range of from 350° C. to 550° C., from 350° C. to 500° C., from 350° C. to 450° C., from 350° C. to 400° C., from 400° C. to 550° C., from 400° ° C. to 500° C., from 400° C. to 450° C., from 450° C. to 550° C., from 450° C. to 500° C. or from 500° C. to 550° C.

In some embodiments, an optional annealing process may be performed after the formation of the layer of second interconnector material 411. In some embodiments, the annealing process may be performed at a temperature greater that the temperature of forming the layer of second interconnector material 411. In some embodiments, the annealing process may be performed at temperatures in the range of from 100° C. to 550° C., from 100° C. to 450° C., from 100° C. to 350° C., from 100° C. to 250° C., from 200° C. to 550° C., from 200° C. to 450° C., from 200° C. to 350° C., from 300° C. to 550° C., from 300° C. to 450° C. or from 400° C. to 550° C.

In some embodiments, the environment of the annealing process may include one or more of an inert gas (e.g., molecular nitrogen, argon) or a reducing gas (e.g., molecular hydrogen or ammonia).

In some embodiments, the duration of the annealing process may be in the range of from 1 hour to 24 hour, from 1 hour to 20 hour, from 1 hour to 15 hour, from 1 hour to 10 hour, from 1 hour to 5 hour, from 5 hour to 24 hour, from 5 hour to 20 hour, from 5 hour to 15 hour, from 5 hour to 10 hour, from 10 hour to 24 hour, from 10 hour to 20 hour, from 10 hour to 15 hour, from 15 hour to 24 hour, from 15 hour to 20 hour or from 20 hour to 24 hour. The annealing process may increase the density, decrease the resistivity, and/or increase the purity of the layer of second interconnector material 411.

Figure 13:
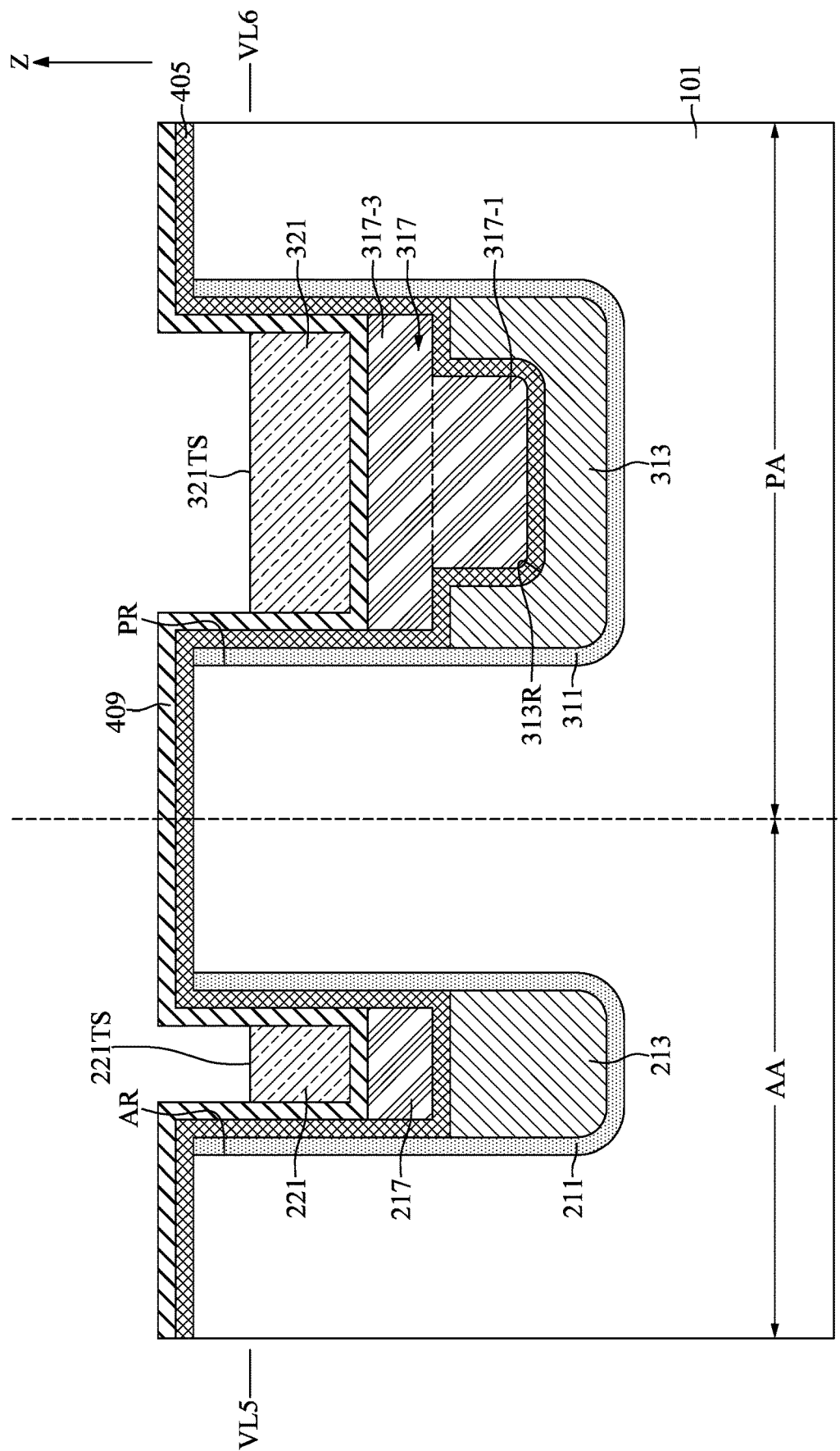

With reference to FIG. 13, a third etching back process may be performed to remove portions of the second interconnector material 411. In some embodiments, the etch rate ratio of the second interconnector material 411 to the second liner material 409 may be between about 100:1 and about 1.05:1, between about 15:1 and about 2:1, or between about 10:1 and about 2:1 during the third etching back process.

After the third etching back process, the remaining second interconnector material 411 in the array recess AR may be referred to as the second array interconnector layer 221. The remaining second interconnector material 411 in the peripheral recess PR may be referred to as the second peripheral interconnector layer 321. In some embodiments, the top surface 221TS of the second array interconnector layer 221 and the top surface 321TS of the second peripheral interconnector layer 321 may be substantially coplanar. In some embodiments, the top surface 221TS of the second array interconnector layer 221 may be at the vertical level VL5 different from the vertical level VL6 of the top surface 321TS of the second peripheral interconnector layer 321.

Figure 14:
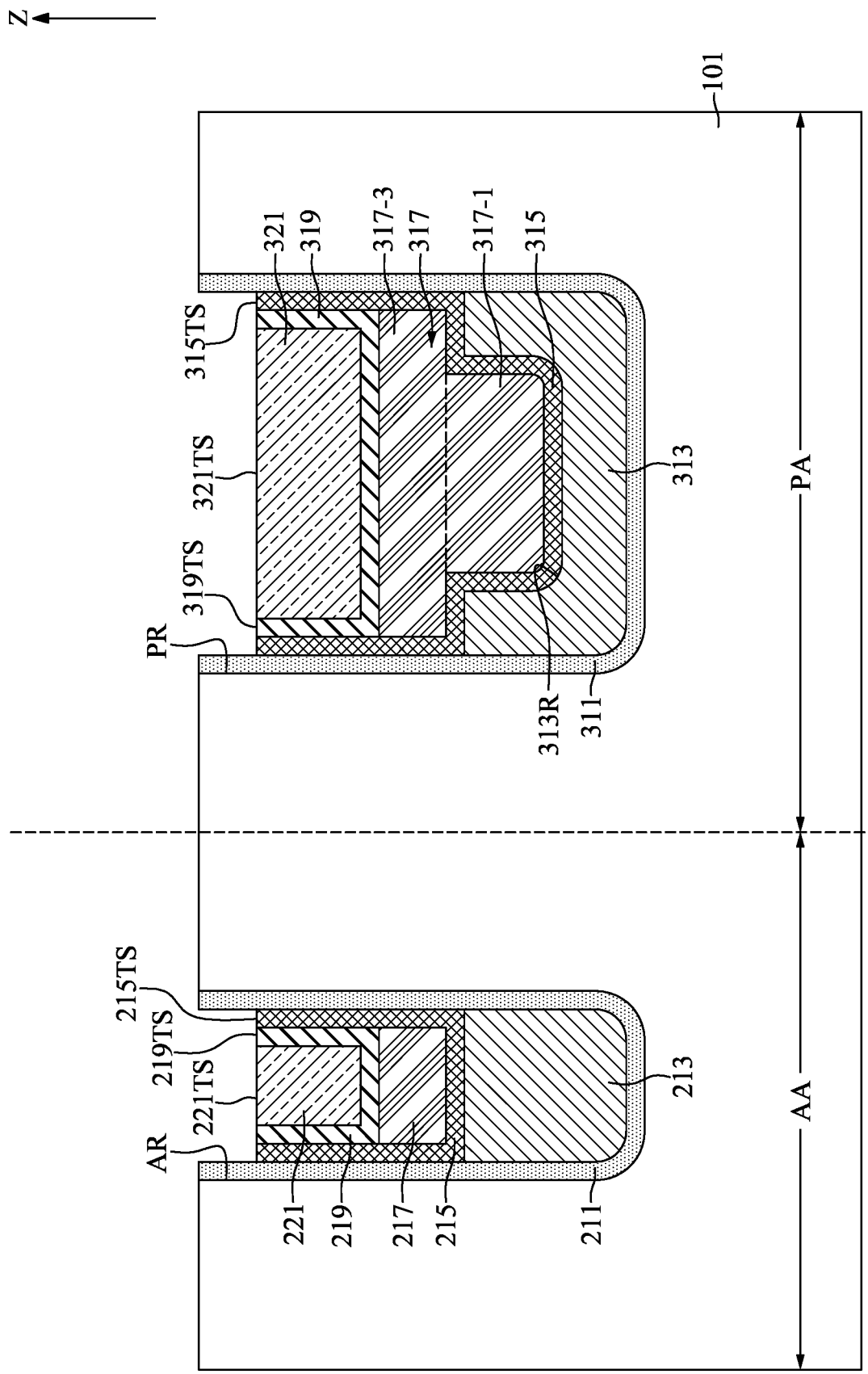

With reference to FIGS. 1 and 14, at step S17, a liner removal process may be performed to turn the layer of second liner material 409 into a second array liner layer 219 and a second peripheral liner layer 319 and turn the layer of first liner material 405 into a first array liner layer 215 and a first peripheral liner layer 315.

With reference to FIG. 14, the liner removal process may be performed to remove portions of the second liner material 409 and the first liner material 405. In some embodiments, the removal rate ratio of the second liner material 409 (and the first liner material 405) to the second array interconnector layer 221 (and the second peripheral interconnector layer 321) may be between about 100:1 and about 1.05:1, between about 15:1 and about 2:1, or between about 10:1 and about 2:1 during the liner removal process. In some embodiments, the removal rate ratio of the second liner material 409 (and the first liner material 405) to the array gate insulating layer 211 (and the peripheral gate insulating layer 311) may be between about 100:1 and about 1.05:1, between about 15:1 and about 2:1, or between about 10:1 and about 2:1 during the liner removal process.

After the liner removal process, the remaining second liner material 409 in the array recess AR may be referred to as the second array liner layer 219. The remaining second liner material 409 in the peripheral recess PR may be referred to as the second peripheral liner layer 319. The remaining first liner material 405 in the array recess AR may be referred to as the first array liner layer 215. The remaining first liner material 405 in the peripheral recess PR may be referred to as the first peripheral liner layer 315. The first array liner layer 215 may have a U-shaped cross-sectional profile. The second array liner layer 219 and the second peripheral liner layer 319 may have a U-shaped cross-sectional profile. In some embodiments, the top surface 215TS of the first array liner layer 215, the top surface 219TS of the second array liner layer 219, the top surface 221TS of the second array interconnector layer 221, the top surface 315TS of the first peripheral liner layer 315, the top surface 319TS of the second peripheral liner layer 319, and the top surface 321TS of the second peripheral interconnector layer 321 may be substantially coplanar.

Figure 15:
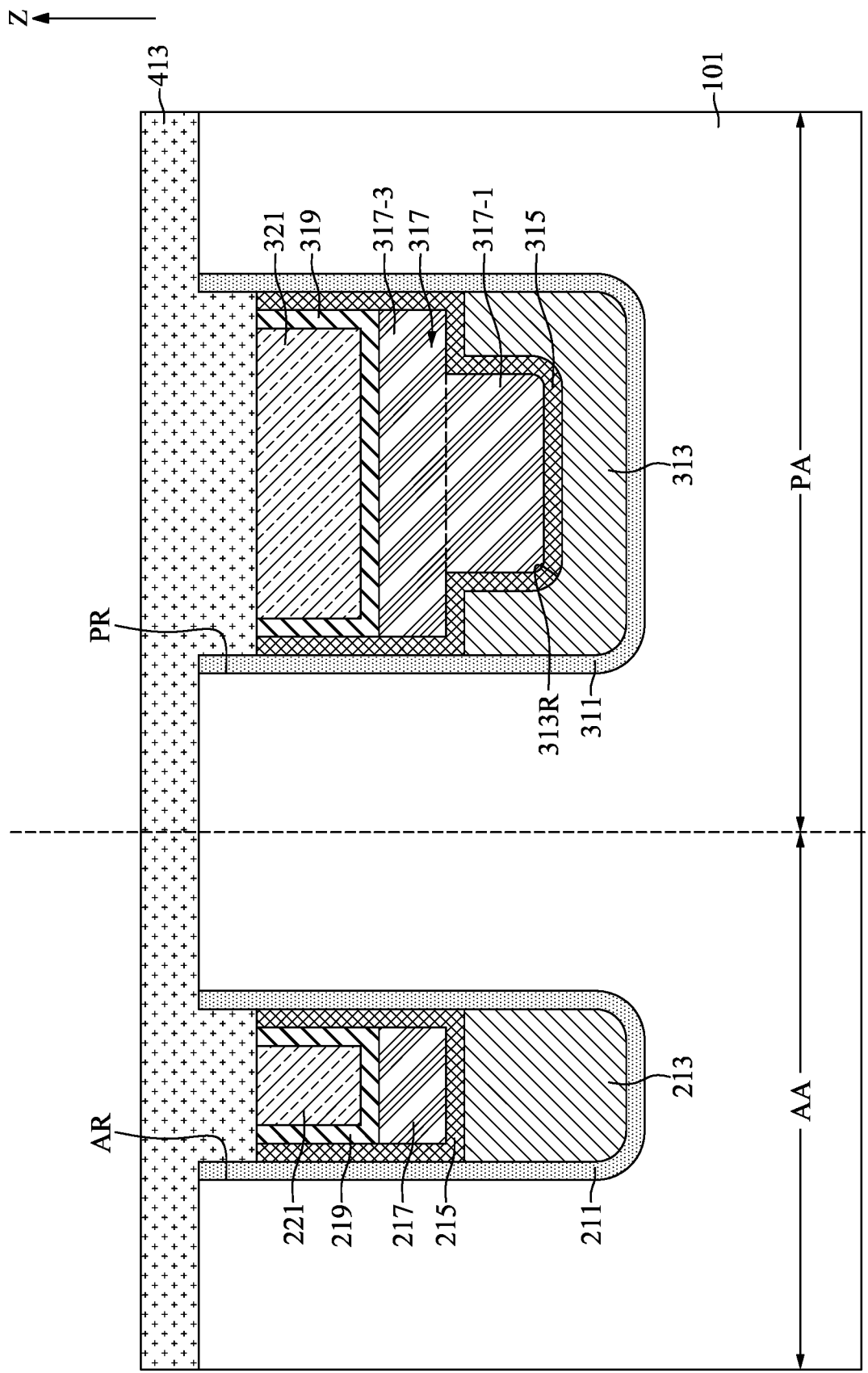
Figure 16:
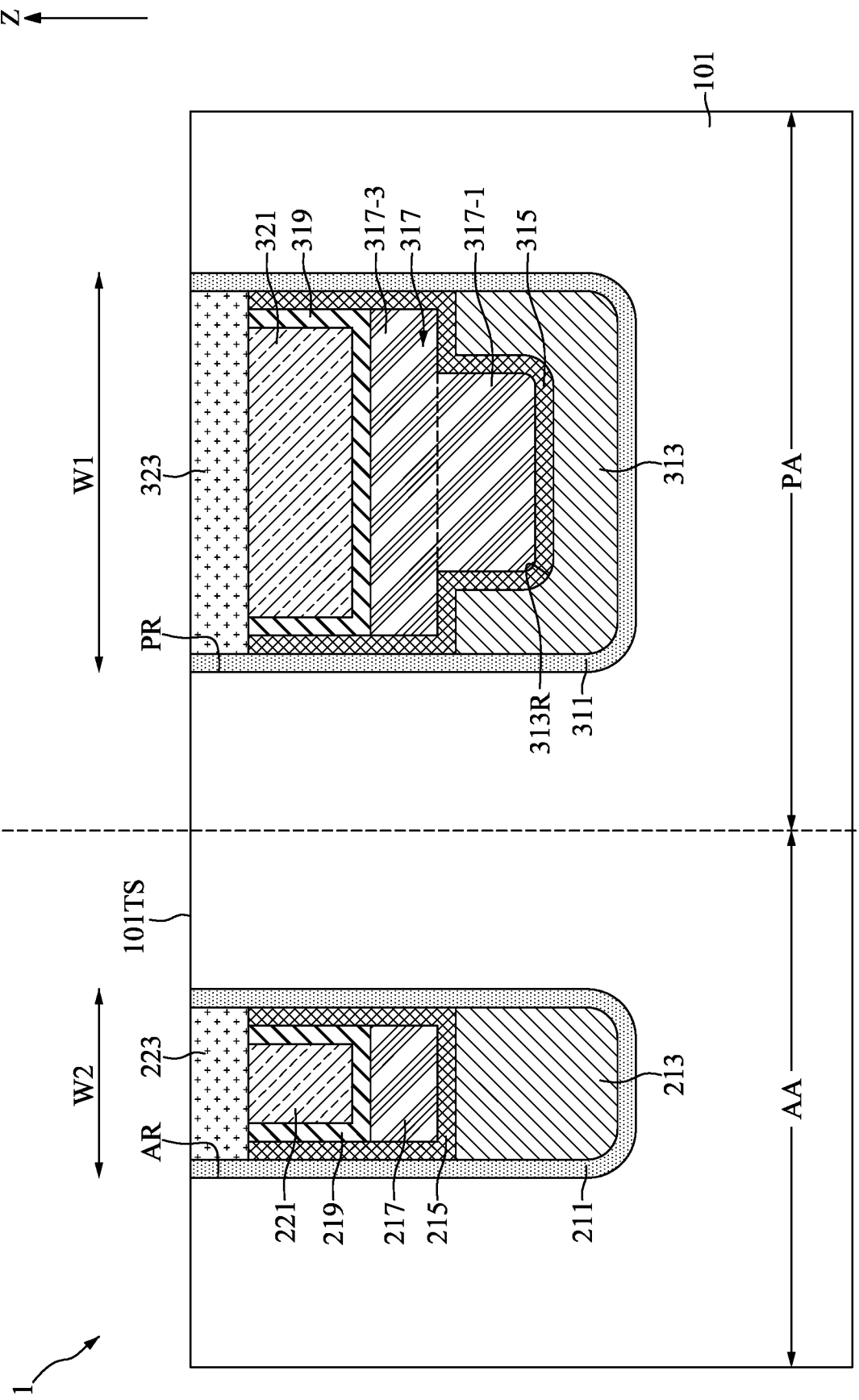

With reference to FIGS. 1, 15, and 16, at step S19, an array capping layer 223 may be formed on the second array interconnector layer 221 to configure an array gate structure 210, and a peripheral capping layer 323 may be formed on the second peripheral interconnector layer 321 to configure a peripheral gate structure 310.

With reference to FIG. 15, a layer of capping material 413 may be formed on the second array interconnector layer 221 and the second peripheral interconnector layer 321 and completely fill the array recess AR and the peripheral recess PR. In some embodiments, the capping material 413 may be, for example, silicon oxide, silicon nitride, silicon oxynitride, silicon nitride oxide, or other applicable insulating materials.

It should be noted that, in the description of the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIG. 16, a planarization process, such as chemical mechanical polishing, may be performed until the top surface 101TS of the substrate 101 is exposed to remove excess material, provide a substantially flat surface for subsequent processing steps, and concurrently form the array capping layer 223 and the peripheral capping layer 323. The array capping layer 223 may be formed on the second array interconnector layer 221, on the second array liner layer 219, on the first array liner layer 215, and in the array recess AR. The peripheral capping layer 323 may be formed on the second peripheral interconnector layer 321, on the second peripheral liner layer 319, on the first peripheral liner layer 315, and in the peripheral recess PR.

With reference to FIG. 16, the array gate insulating layer 211, the array work function layer 213, the first array liner layer 215, the first array interconnector layer 217, the second array liner layer 219, the second array interconnector layer 221, and the array capping layer 223 together configure the array gate structure 210. The first array liner layer 215 and the first array interconnector layer 217 may be configured to tune the work function cooperating with the array work function layer 213 so as to obtain the array gate structure 210 has a low resistance. As a result, the performance of the array gate structure 210 may be improved.

With reference to FIG. 16, the peripheral gate insulating layer 311, the peripheral work function layer 313, the first peripheral liner layer 315, the first peripheral interconnect layer 317, the second peripheral liner layer 319, the second peripheral interconnector layer 321, and the peripheral capping layer 323 together configure the peripheral gate structure 310. The first peripheral liner layer 315 and the first peripheral interconnect layer 317 may be configured to tune the work function cooperating with the peripheral work function layer 313 so as to obtain the peripheral gate structure 310 has a low resistance. As a result, the performance of the peripheral gate structure 310 may be improved.

With reference to FIG. 16, the shape of the array gate structure 210 and the shape of the peripheral gate structure 310 may be determined by the profile of the array recess AR and the profile of the peripheral recess PR, respectively and correspondingly. That is, the array gate structure 210 may have the width W2 and the peripheral gate structure 310 may have the width W1. The width W1 of the peripheral gate structure 310 may be greater than at least two times the width W2 of the array gate structure 210.

In some embodiments, the array gate structure 210 and the peripheral gate structure 310 may have a work function greater than or equal to 4.3 eV. In some embodiments, the array gate structure 210 and the peripheral gate structure 310 may have a work function greater than or equal to 4.5 eV. In some embodiments, the array gate structure 210 and the peripheral gate structure 310 may have a work function greater than or equal to 4.3 eV, including greater than or equal to 4.4 eV, greater than or equal to 4.5 eV, greater than or equal to 4.6 eV, greater than or equal to 4.7 eV, greater than or equal to 4.8 eV, greater than or equal to 4.9 eV, greater than or equal to 5.0 eV, greater than or equal to 5.1 eV, or greater than or equal to 5.2 eV.

In some embodiments, the array gate structure 210 and the peripheral gate structure 310 may have a resistance less than or equal to 40 μΩ-cm, less than or equal to 30 μΩ-cm, less than or equal to 25 μΩ-cm, or less than or equal to 20 μΩ-cm, or less than or equal to 15 μΩ-cm at a total thickness of 100 Å. In some embodiments, the array gate structure 210 and the peripheral gate structure 310 may has resistance less than or equal to 20 μΩ-cm at a total thickness of 100 Å. In some embodiments, the array gate structure 210 and the peripheral gate structure 310 may have a resistance in a range of from 50 μΩ-cm to 5 μΩ-cm, from 40 μΩ-cm to 10 μΩ-cm, from 30 μΩ-cm to 10 μΩ-cm, from 25 μΩ-cm to 10 μΩ-cm, from 20 μΩ-cm to 10 μΩ-cm at a total thickness of 100 Å.

One aspect of the present disclosure provides a semiconductor device including a substrate; a peripheral gate structure including: a peripheral gate insulating layer inwardly positioned in the substrate and including a U-shaped cross-sectional profile, a peripheral work function layer positioned on the peripheral gate insulating layer and including a recess, a first peripheral interconnect layer positioned on the peripheral work function layer, a first peripheral liner layer positioned between the peripheral work function layer and the first peripheral interconnect layer, and a peripheral capping layer positioned on the first peripheral interconnect layer. The peripheral work function layer includes titanium, titanium nitride, silicon, silicon germanium, or a combination thereof. The first peripheral liner layer includes graphene. The first peripheral interconnect layer includes tungsten, tungsten nitride, or a combination thereof.

Another aspect of the present disclosure provides a semiconductor device including a substrate including an array area and a peripheral area; an array gate structure positioned in the array area of the substrate; and a peripheral gate structure including: a peripheral gate insulating layer inwardly positioned in the peripheral area of the substrate and including a U-shaped cross-sectional profile, a peripheral work function layer positioned on the peripheral gate insulating layer and including a recess, a first peripheral interconnect layer positioned on the peripheral work function layer, a first peripheral liner layer positioned between the peripheral work function layer and the first peripheral interconnect layer, and a peripheral capping layer positioned on the first peripheral interconnect layer. A width of the peripheral gate structure is greater than two times a width of the array gate structure. The peripheral work function layer includes titanium, titanium nitride, silicon, silicon germanium, or a combination thereof. The first peripheral liner layer includes graphene. The first peripheral interconnect layer includes tungsten, tungsten nitride, or a combination thereof.

Another aspect of the present disclosure provides a method for fabricating a semiconductor device including providing a substrate including an array area and a peripheral area; an array recess in the array area and forming a peripheral recess in the peripheral area; conformally forming an array gate insulating layer in the array recess and conformally forming a peripheral gate insulating layer in the peripheral recess; forming an array work function layer on the array gate insulating layer and forming a peripheral work function layer including a U-shaped cross-sectional profile on the peripheral gate insulating layer; conformally forming a layer of first liner material on the array work function layer and on the peripheral work function layer; forming a first array interconnector layer above the array work function layer and forming a first peripheral interconnect layer above the peripheral work function layer; performing a liner removal process to turn the layer of first liner material into a first array liner layer between the first array interconnector layer and the array work function layer and into a first peripheral liner layer between the first peripheral interconnect layer and the peripheral work function layer; and forming an array capping layer on the first array interconnector layer and forming a peripheral capping layer on the first peripheral interconnect layer. A width of the peripheral recess is greater than two times a width of the array recess.

Due to the design of the semiconductor device of the present disclosure, the peripheral work function layer 313, the first peripheral liner layer 315, and the first peripheral interconnect layer 317 may make the peripheral gate structure 310 have a low resistance. Therefore, the performance of the peripheral gate structure 310 may be improved. As a result, the performance of the semiconductor device 1 may also be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a substrate;
a peripheral gate structure comprising:
   a peripheral gate insulating layer inwardly positioned in the substrate and comprising a U-shaped cross-sectional profile;
   a peripheral work function layer positioned on the peripheral gate insulating layer and comprising a recess;
   a first peripheral interconnect layer positioned on the peripheral work function layer;
   a first peripheral liner layer positioned between the peripheral work function layer and the first peripheral interconnect layer; and
   a peripheral capping layer positioned on the first peripheral interconnect layer, wherein the peripheral work function layer comprises titanium, titanium nitride, silicon, silicon germanium, or a combination thereof, wherein the first peripheral liner layer comprises graphene, wherein the first peripheral interconnect layer comprises tungsten, tungsten nitride, or a combination thereof, wherein the first peripheral interconnect layer comprises a bottom portion positioned in the recess and a top portion positioned on the bottom portion, wherein a width of the bottom portion is less than a width of the top portion;
a second peripheral interconnector layer positioned between the first peripheral interconnect layer and the peripheral capping layer; and
a second peripheral liner layer positioned between the first peripheral interconnect layer and the second peripheral interconnector layer;
wherein the second peripheral liner layer comprises graphene;
wherein the second peripheral interconnector layer comprises molybdenum;
wherein the peripheral gate insulating layer comprises silicon oxide, silicon nitride, a high-k material, or a combination thereof;
wherein a top surface of the second peripheral interconnector layer and a top surface of the first peripheral liner layer are substantially coplanar.

2. A semiconductor device, comprising:
a substrate comprising an array area and a peripheral area;
an array gate structure positioned in the array area of the substrate;
a peripheral gate structure comprising:
   a peripheral gate insulating layer inwardly positioned in the peripheral area of the substrate and comprising a U-shaped cross-sectional profile;
   a peripheral work function layer positioned on the peripheral gate insulating layer and comprising a recess;
   a first peripheral interconnect layer positioned on the peripheral work function layer;
   a first peripheral liner layer positioned between the peripheral work function layer and the first peripheral interconnect layer; and
   a peripheral capping layer positioned on the first peripheral interconnect layer;
a second peripheral interconnector layer; and
a second peripheral liner layer;
wherein a width of the peripheral gate structure is greater than two times a width of the array gate structure;
wherein the peripheral work function layer comprises titanium, titanium nitride, silicon, silicon germanium, or a combination thereof;
wherein the first peripheral liner layer comprises graphene; and
wherein the first peripheral interconnect layer comprises tungsten, tungsten nitride, or a combination thereof;
wherein the first peripheral interconnect layer comprises a bottom portion positioned in the recess and a top portion positioned on the bottom portion, wherein a width of the bottom portion is less than a width of the top portion;
wherein the second peripheral interconnector layer is positioned between the first peripheral interconnect layer and the peripheral capping layer, wherein the second peripheral liner layer is positioned between the first peripheral interconnect layer and the second peripheral interconnector layer;
wherein the second peripheral liner layer comprises graphene;
wherein the second peripheral interconnector layer comprises molybdenum; and
wherein the peripheral gate insulating layer comprises silicon oxide, silicon nitride, a high-k material, or a combination thereof;

wherein a top surface of the second peripheral interconnector layer and a top surface of the first peripheral liner layer are substantially coplanar.

3. The semiconductor device of claim 2, wherein the array gate structure comprises:
an array gate insulating layer inwardly positioned in the array area of the substrate and comprising a U-shaped cross-sectional profile;
an array work function layer positioned on the array gate insulating layer;
a first array interconnector layer positioned on the array work function layer;
a first array liner layer positioned between the array work function layer and the first array interconnector layer;
a second array interconnector layer positioned on the first array interconnector layer;
a second array liner layer positioned between the second array interconnector layer and the first array interconnector layer; and
an array capping layer positioned on the second array interconnector layer.

4. The semiconductor device of claim 3, wherein a top surface of the array work function layer and a top surface of the peripheral work function layer are substantially coplanar.

5. The semiconductor device of claim 3, wherein a top surface of the array work function layer and a top surface of the peripheral work function layer are at different vertical levels.

6. The semiconductor device of claim 3, wherein a top surface of the first array interconnector layer and a top surface of the first peripheral interconnect layer are substantially coplanar.

7. The semiconductor device of claim 3, wherein a top surface of the first array interconnector layer and a top surface of the first peripheral interconnect layer are at different vertical levels.

\* \* \* \* \*